United States Patent
Park et al.

(10) Patent No.: US 10,162,265 B2
(45) Date of Patent: *Dec. 25, 2018

(54) PATTERN TREATMENT METHODS

(71) Applicants: Rohm and Haas Electronic Materials LLC, Marlborough, MA (US); Dow Global Technologies LLC, Midland, MI (US)

(72) Inventors: Jong Keun Park, Shrewsbury, MA (US); Mingqi Li, Shrewsbury, MA (US); Amy M. Kwok, Shrewsbury, MA (US); Phillip D. Hustad, Pearland, TX (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/296,592

(22) Filed: Oct. 18, 2016

(65) Prior Publication Data

US 2017/0170008 A1    Jun. 15, 2017

Related U.S. Application Data

(60) Provisional application No. 62/265,385, filed on Dec. 9, 2015.

(51) Int. Cl.
*G03F 7/40* (2006.01)
*C09D 125/08* (2006.01)
(Continued)

(52) U.S. Cl.
CPC .............. *G03F 7/40* (2013.01); *C08F 297/02* (2013.01); *C09D 125/08* (2013.01);
(Continued)

(58) Field of Classification Search
CPC .................................. G03F 7/0035; G03F 7/40
See application file for complete search history.

(56) References Cited

U.S. PATENT DOCUMENTS

| 7,553,610 B2 | 6/2009 | Kaneko et al. |
| 7,745,077 B2 | 6/2010 | Thiyagarajan et al. |

(Continued)

FOREIGN PATENT DOCUMENTS

| JP | 2002023389 A | 1/2002 |
| JP | 2003316026 A | 11/2003 |

(Continued)

OTHER PUBLICATIONS

Cheng, et al, "EUVL compatible, LER solutions using functional block copolymers", Proc. of SPIE, vol. 8323, 2012, pp. 832310-1-11.

(Continued)

*Primary Examiner* — Kathleen Duda
(74) *Attorney, Agent, or Firm* — Jonathan D. Baskin

(57) ABSTRACT

Pattern treatment methods comprise: (a) providing a semiconductor substrate comprising a patterned feature on a surface thereof; (b) applying a pattern treatment composition to the patterned feature, wherein the pattern treatment composition comprises a polymer comprising a surface attachment group for forming a bond with a surface of the patterned feature and a solvent, and wherein the pattern treatment composition is free of crosslinkers; (c) removing residual pattern treatment composition from the substrate with a first rinse agent, leaving a coating of the polymer over and bonded to the surface of the patterned feature; and (d) rinsing the polymer-coated patterned feature with a second rinse agent that is different from the first rinse agent, wherein the polymer has a solubility that is greater in the first rinse agent than in the second rinse agent. The methods find (Continued)

particular applicability in the manufacture of semiconductor devices for providing high resolution patterns.

10 Claims, 6 Drawing Sheets

(51) Int. Cl.
| | |
|---|---|
| *C09D 133/10* | (2006.01) |
| *G03F 7/039* | (2006.01) |
| *G03F 7/11* | (2006.01) |
| *H01L 21/02* | (2006.01) |
| *H01L 21/027* | (2006.01) |
| *C08F 297/02* | (2006.01) |
| *G03F 7/32* | (2006.01) |
| *H01L 21/033* | (2006.01) |

(52) U.S. Cl.
CPC ........... *C09D 133/10* (2013.01); *G03F 7/039* (2013.01); *G03F 7/0397* (2013.01); *G03F 7/11* (2013.01); *G03F 7/325* (2013.01); *G03F 7/405* (2013.01); *H01L 21/0206* (2013.01); *H01L 21/0273* (2013.01); *H01L 21/033* (2013.01)

(56) References Cited

U.S. PATENT DOCUMENTS

| | | | |
|---|---|---|---|
| 9,448,483 B2* | 9/2016 | Hustad | G03F 7/325 |
| 9,665,005 B2* | 5/2017 | Jain | G03F 7/405 |
| 9,671,697 B2* | 6/2017 | Zhou | G03F 7/002 |
| 9,684,241 B2* | 6/2017 | Jain | G03F 7/168 |
| 9,703,203 B2* | 7/2017 | Jain | G03F 7/40 |
| 2010/0239984 A1 | 9/2010 | Tsubaki | |
| 2011/0147983 A1 | 6/2011 | Cheng et al. | |
| 2013/0210231 A1 | 8/2013 | Senzaki et al. | |
| 2013/0240481 A1 | 9/2013 | Senzaki et al. | |
| 2014/0242359 A1 | 8/2014 | Nakamura et al. | |
| 2015/0086929 A1 | 3/2015 | Hatakeyama et al. | |
| 2015/0118852 A1 | 4/2015 | Lee et al. | |
| 2015/0338744 A1 | 11/2015 | Hatakeyama et al. | |
| 2016/0033869 A1 | 2/2016 | Hustad et al. | |
| 2016/0187782 A1* | 6/2016 | Hustad | H01L 21/31144 438/703 |
| 2016/0195814 A1 | 7/2016 | Enomoto et al. | |
| 2016/0357109 A1* | 12/2016 | Jain | G03F 7/405 |
| 2016/0357110 A1 | 12/2016 | Zhou et al. | |
| 2016/0357111 A1 | 12/2016 | Jain et al. | |
| 2016/0357112 A1 | 12/2016 | Jain et al. | |

FOREIGN PATENT DOCUMENTS

| | | |
|---|---|---|
| WO | 2013065878 A1 | 5/2013 |
| WO | 2014127430 A1 | 8/2014 |
| WO | 2014163332 A1 | 10/2014 |

OTHER PUBLICATIONS

Namie, et al. "Polymer blends for directed self-assembly," Proc. of SPIE, vol. 8680, 2013, pp. 86801M-1-5.

Ya-Min Chuang, et al, "Using directed self-assembly of block copolymer nanostructures to modulate nanoscale surface roughness: Towards a novel lithographic process", Advanced Functional Materials, 2013, pp. 173-831, vol. 23.

Ya-Min Chuang, et al, "Healing LER using directed self-assembly: treatment of EUVL resists with aqueous solutions of block copolymers", Proc. of SPIE, 2013, pp. 868009-1 to 868009-10, vol. 8680.

Oyama, et al, "The enhanced photoresist shrink process technique toward 22nm node", Proc. of SPIE, Advances in Resist Materials and Processing Technology XXVIII, 2011, pp. 79722Q, vol. 7972.

Peters, "Resists Join the Sub-Lambda Revolution", 1999, Semiconductor International, Sep. 9, pp. 70-78.

* cited by examiner

PATTERN TREATMENT METHODS

FIELD OF THE INVENTION

The invention relates generally to the manufacture of electronic devices. More specifically, this invention relates to methods for treating patterns on semiconductor device substrates. The methods find particular use in the manufacture of semiconductor devices in shrink processes for the formation of fine patterns.

BACKGROUND OF THE INVENTION

In the semiconductor manufacturing industry, to extend resolution capabilities beyond those obtained with standard resist patterning techniques, various processes for pattern shrink have been proposed. These processes involve increasing the effective thickness of the resist pattern sidewalls to reduce (i.e., "shrink") the spacing, for example, between adjacent lines or within a trench or hole pattern. In this way, features such as trenches and contact holes formed from the patterns can be made smaller. Known shrink techniques include, for example, chemical vapor deposition (CVD) assist, acid diffusion resist growth, thermal flow and polymer blend self-assembly.

The CVD assist shrink process (see K. Oyama et al, "The enhanced photoresist shrink process technique toward 22 nm node", *Proc. SPIE* 7972, Advances in Resist Materials and Processing Technology XXVIII, 79722Q (2011)), uses a CVD-deposited layer formed over a photoresist pattern including, for example, contact hole, line/space or trench patterns. The CVD material is etched back, leaving the material on sidewalls of the resist pattern. This increases the effective lateral dimensions of the resist pattern, thereby reducing the open areas that expose the underlying layer to be etched. The CVD assist shrink technique requires use of CVD and etching tools which are costly, add to the complexity of the process and are disadvantageous in terms of process throughput.

In the acid diffusion resist growth process, also referred to as the RELACS process (see L. Peters, "Resists Join the Sub-λ Revolution", *Semiconductor International*, 1999. 9), an acid-catalyzed crosslinkable material is coated over a positive tone developed (PTD) resist patterned surface. Crosslinking of the material is catalyzed by an acid component present in the resist pattern that diffuses into the crosslinkable material during a baking step. The crosslinking takes place in the material in the vicinity of the resist pattern in the acid diffusion region to form a coating on sidewalls of the pattern, thereby reducing the lateral dimension of open areas of the pattern. This process typically suffers from iso-dense bias (IDB), wherein growth of the crosslinked layer on the resist pattern occurs non-uniformly across the die surface depending on density (spacing between) adjacent resist patterns. As a result, the extent of "shrink" for identical features can vary across die based on pattern density. This can lead to patterning defects and variations in electrical characteristics across the die for what are intended to be identical devices.

Polymer blend self-assembly (see Y. Namie et al, "Polymer blends for directed self-assembly", *Proc. SPIE* 8680, Alternative Lithographic Technologies V, 86801M (2013)) involves coating a composition containing an immiscible blend of hydrophilic and hydrophobic polymers over the photoresist pattern. The composition is then annealed, causing the polymers to phase separate, wherein the hydrophilic polymer preferentially segregates to the resist pattern sidewalls and the hydrophobic polymer fills the remainder of the volume between the resist pattern sidewalls. The hydrophobic polymer is next removed by solvent development, leaving the hydrophilic polymer on the resist pattern sidewalls. Polymer blend self-assembly has been found to suffer from proximity and size effects. As the shrink ratio is determined by the volume ratio of the two polymers, all features shrink by the same relative percentage rather than by the same absolute amount. This can lead to the same problems described with respect to the acid diffusion resist growth technique.

A polymer grafting shrink technique has also been proposed (see, e.g., U.S. Patent Application Pub. No. 2015/0086929A1). As shown in FIGS. 1A and 1B, in this process, a photoresist pattern 1 and substrate 2 is overcoated with a shrink composition 3 containing a polymer having a group which bonds to the surface of the resist pattern. Following rinse of residual unbound polymer with a solvent, a layer 3 of the bonded polymer from the shrink composition remains over the photoresist pattern. The inventors have observed that attachment of the polymer to the resist pattern can result in a footing layer 4 being formed on the substrate surface. The occurrence of footing can result from bonding of the polymer to the substrate surface and wetting of the polymer bonded to resist sidewalls onto the polymer bonded to the substrate. The occurrence of footing is undesirable in that it can result in patterning defects, for example, bridging defects or missing contact holes, which can adversely impact device yield.

There is a continuing need in the art for improved pattern treatment methods which address one or more problems associated with the state of the art and which allow for the formation of fine patterns in electronic device fabrication.

SUMMARY

In accordance with a first aspect of the invention, pattern treatment methods are provided. The methods comprise: (a) providing a semiconductor substrate comprising a patterned feature on a surface thereof; (b) applying a pattern treatment composition to the patterned feature, wherein the pattern treatment composition comprises a polymer comprising a surface attachment group for forming a bond with a surface of the patterned feature and a solvent, and wherein the pattern treatment composition is free of crosslinkers; (c) removing residual pattern treatment composition from the substrate with a first rinse agent, leaving a coating of the polymer over and bonded to the surface of the patterned feature; and (d) rinsing the polymer-coated patterned feature with a second rinse agent that is different from the first rinse agent, wherein the polymer has a solubility that is greater in the first rinse agent than in the second rinse agent. The invention finds particular applicability in the manufacture of semiconductor devices for providing high resolution patterns.

The terminology used herein is for the purpose of describing particular embodiments only and is not intended to be limiting of the invention. As used herein, the singular forms "a", "an" and "the" are intended to include both singular and plural forms, unless the context clearly indicates otherwise.

BRIEF DESCRIPTION OF THE DRAWINGS

The present invention will be described with reference to the following drawings, in which like reference numerals denote like features, and in which.

DETAILED DESCRIPTION

Pattern Treatment Compositions

Figure 1B:
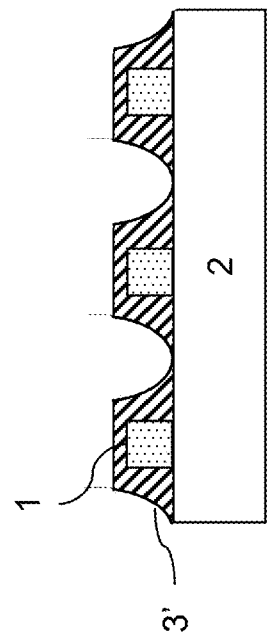
FIG. 1A-B shows in cross-section a substrate of the related art at various stages of pattern formation.
Figure 1A:
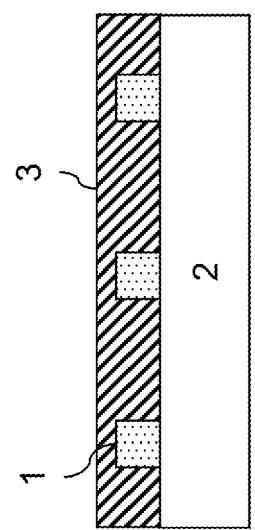

Pattern treatment compositions useful in the methods of the invention include a polymer and a solvent, and can include one or more additional, optional components. The compositions, when coated over a patterned feature, for example, a contact hole, trench or line and space pattern, can allow for a consistent shrink value regardless of feature size or density. That is, the compositions can allow for a coated pattern exhibiting minimal or no proximity bias. In addition, the pattern treatment compositions can be coated using a spin-coating tool, thereby allowing for simplified processing and ease in integration with the photoresist patterning process.

Suitable polymers include those that can become bonded to the surface of the patterned feature through a reactive surface attachment group to form a layer over the patterned feature. The layer can be formed, for example, by ionic and/or hydrogen bonding of the polymer to the surface of the patterned feature. Suitable polymers for the pattern treatment compositions include homopolymers and copolymers. The copolymers can be random copolymers, block copolymers (BCPs) or a combination thereof. The random copolymers can include two, three, four or more different units. The block copolymers can be multiblock copolymers, for example, diblock, triblock, tetrablock, or higher order block copolymers, wherein one or more block can include a random or alternating copolymer. The blocks can be part of a linear copolymer, a branched copolymer where the branches are grafted onto a backbone (these copolymers are also sometimes called "comb copolymers"), a star copolymer, or the like.

The polymer comprises a reactive surface attachment group for forming a bond, for example, a hydrogen bond and/or an ionic bond, with the surface of the patterned feature. The reactive surface attachment group can be present, for example, as a group pendant to the polymer backbone such as in one or more repeat unit of the polymer, or as part of an endgroup of the polymer. The particular site on the patterned feature surface with which the reactive surface attachment group forms a bond will depend on the particular material of the pattern. For example, in the case of an organic photoresist pattern, the surface attachment group will typically form a bond at sites where one or more group such as acid and/or alcohol groups are present on the resist pattern surface. Such groups may be present as a result of deprotection reaction during the resist patterning process and/or as part of the original photoresist polymer. Preferably, the pattern is a photoresist pattern formed by a negative tone development (NTD) process using an organic solvent developer. The surface attachment group preferably includes a group containing a hydrogen acceptor effective to form a bond, preferably an ionic or hydrogen bond, with the deprotected acid group and/or alcohol group at exposed surfaces of the resist pattern.

Preferable surface attachment groups include, for example, one or more group chosen from: amines, for example, primary amines, secondary amines, and tertiary amines; amides; imines, for example, primary and secondary aldimines and ketimines; diazines, for example optionally substituted pyrazine, piperazine, phenazine; diazole, for example, optionally substituted pyrazole, thiadiazole and imidazole; optionally substituted pyridine, for example, pyridine, 2-vinylpyridine and 4-vinylpyridine; and combinations thereof. The surface attachment group is preferably pendant to the polymer backbone, and preferably takes the form of a ring pendant to the polymer backbone, for example, optionally substituted pyridine, indole, imidazole, triazine, pyrrolidine, azacyclopropane, azacyclobutane, piperidine, pyrrole, purine, diazetidine, dithiazine, azocane, azonane, quinoline, carbazole, acridine, indazole and benzimidazole.

Suitable monomer units containing a surface attachment group include, for example, 2-(N,N-dimethylamino)ethyl methacrylate, 2-(N,N-dimethylamino)ethyl acrylate, 2-(N,N-diethylamino)ethyl methacrylate, 2-(tert-butylamino)ethyl methacrylate, 2-N-morpholinoethyl acrylate, 2-N-morpholinoethyl methacrylate, 3-dimethylaminoneopentyl acrylate, N-(t-BOC-aminopropyl) methacrylamide, N-[2-(N,N-dimethylamino)ethyl]methacrylamide, N-[3-(N,N-dimethylamino)propyl]acrylamide, N-[3-(N,N-dimethylamino)propyl]methacrylamide, 2-vinylpyridine, 4-vinylpyridine, N-(3-aminopropyl)methacrylamide, 2-aminoethyl methacrylate, 4-N-tert-Butoxycarbonyl piperidine-1-methacrylate, 2-(dimethylamino)styrene, 4-(dimethylamino)styrene, 2-vinylpyridine, 4-vinylpyridine, and N-vinylpyrrolidone. When the pattern treatment polymer is based on polysiloxane chemistry, the monomer unit is typically an amine-functional siloxane monomer including, for example, n-(acetylglycyl)-3-aminopropyltrimethoxysilane, 3-(n-allylamino)propyltrimethoxysilane, allylaminotrimethylsilane, 4-aminobutyltriethoxysilane, 4-amino-3,3-dimethylbutylmethyldimethoxysilane, 4-amino-3,3-dimethylbutyltrimethoxysilane, n-(2-aminoethyl)-3-aminoisobutyldimethylmethoxysilane, n-(2-aminoethyl)-3-aminoisobutylmethyldimethoxysilane, (aminoethylaminomethyl)phenethyltrimethoxysilane, n-(2-aminoethyl)-3-aminopropylmethyldiethoxysilane, n-(2-aminoethyl)-3-aminopropylmethyldimethoxysilane, n-(2-aminoethyl)-3-aminopropyltriethoxysilane, n-(2-aminoethyl)-3-aminopropyltrimethoxysilane, n-(2-aminoethyl)-2,2,4-trimethyl-1-aza-2-silacyclopentane, n-(6-aminohexyl)aminomethyltriethoxysilane, n-(6-aminohexyl)aminomethyltrimethoxysilane, n-(2-aminoethyl)-11-aminoundecyltrimethoxysilane, 3-(m-aminophenoxy)propyltrimethoxysilane, m-aminophenyltrimethoxysilane, p-aminophenyltrimethoxysilane, n-3-[amino(polypropylenoxy)]aminopropyltrimethoxysilane, 3-aminopropylmethyldiethoxysilane, 3-aminopropyltriethoxysilane, 3-aminopropyltrimethoxysilane, 11-aminoundecyltriethoxysilane, n-(2-n-benzylaminoethyl)-3-aminopropyltrimethoxysilane, n-butylaminopropyltrimethoxysilane, t-butylaminopropyltrimethoxysilane, (n-cyclohexylaminomethyl)triethoxysilane, (n-cyclohexylaminomethyl)trimethoxysilane, (n,n-diethyl-3-aminopropyl)trimethoxysilane, n,n-dimethyl-3-aminopropylmethyldimethoxysilane, (n,n-dimethyl-3-aminopropyl)trimethoxysilane, (3-(n-ethylamino)isobutyl)trimethoxysilane, n-methylaminopropylmethyldimethoxysilane, n-methylaminopropyltrimethoxysilane, (phenylaminomethyl)methyldimethoxysilane and n-phenylaminopropyltrimethoxysilane. By selection of a suitable polymer, the thickness of the polymer on the patterned feature exposed surfaces can be accurately controlled. This thickness can be controlled, for example, by selection of a suitable molecular weight, with higher molecular weights typically resulting in greater thicknesses and lower molecular weights typically resulting in lesser thicknesses. The chemical composition of the polymer can also influence the amount of growth. For example, polymers with a longer unperturbed end-to-end distance or more rigid backbones provide larger shrink for a given molecular weight.

When the surface attachment group is part of a repeating unit of the polymer, such unit is typically present in the polymer in an amount of from 0.001 to 100 mole %, from 0.01 to 50 mole %, from 0.1 to 20 mole %, from 0.1 to 10 mole %, based on the polymer. The surface attachment group can additionally or alternatively be present as one or more endgroup of the polymer.

The polymer preferably has, in addition to the surface attachment group, a "smoothing" component which allows for the polymer layer over the patterned feature to have a smooth surface with low linewidth roughness (LWR). The surface attachment group and smoothing component are typically on different blocks of a block copolymer. Suitable materials for the smoothing component of the polymer include vinyl aromatic monomers, acrylate monomers, (alkyl)acrylate monomers, polysiloxanes, poly(dimethylsilabutane)s, or combinations thereof. Suitable vinyl aromatic monomers for the smoothing component include styrene, o-methylstyrene, p-methyl styrene, m-methyl styrene, α-methylstyrene, ethyl styrene, α-methyl-p-methylstyrene, 2,4-dimethyl styrene, monochlorostyrene, 4-tert-butyl styrene, or the like, or a combination comprising at least one of the foregoing alkylstyrene monomers. The vinyl aromatic monomers can also include pendent silicon atoms as represented by formula (1):

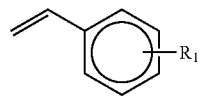
(1)

wherein $R_1$ is $SiR_2$ where $R_2$ is a $C_1$-$C_{10}$ alkyl, $OSiMe_2SiMe_3$, $O(SiMe_2)_2SiMe_3$, $SiMe_2SiMe_3$, $(SiMe_2)_2SiMe_3$, or the like. Exemplary styrene monomers that include pendent silicon atoms are shown in formulas (2)-(4):

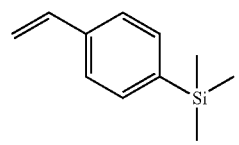
(2)

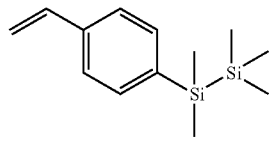
(3)

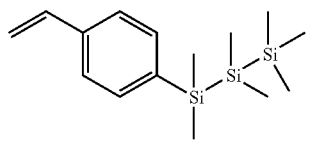
(4)

Suitable (alkyl)acrylate monomers for the smoothing component can have a structure derived from a monomer represented by formula (5):

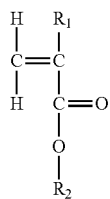
(5)

wherein $R_1$ is a hydrogen or an alkyl or fluoroalkyl group having 1 to 10 carbon atoms and $R_2$ is a $C_1$-$C_{10}$ alkyl, a $C_3$-$C_{10}$ cycloalkyl, or a $C_7$-$C_{10}$ aralkyl group. Examples of the (alkyl)acrylates are methacrylate, ethacrylate, propyl acrylate, methyl methacrylate, methyl ethylacrylate, methyl propylacrylate, ethyl ethylacrylate, methyl arylacrylate, and the like, or a combination comprising at least one of the foregoing acrylates. The term "(alkyl)acrylate" implies that either an acrylate or alkylacrylate (e.g., methacrylate) is contemplated unless otherwise specified. Exemplary examples of acrylate monomers for the smoothing component are poly(t-butylmethacrylate), poly(methylmethacrylate), poly(ethylmethacrylate) and poly(propylmethacrylate).

The acrylate monomers can also include pendent silicon atoms as represented by the formula (6):

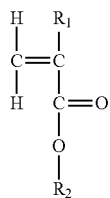
(6)

wherein $R_2$ contains silicon, for example, $R_2$=$SiR_3$ wherein $R_3$ is a $C_1$-$C_{10}$ alkyl, $OSiMe_2SiMe_3$, $O(SiMe_2)_2SiMe_3$, $SiMe_2SiMe_3$, $(SiMe_2)_2SiMe_3$, $CH_2SiMe_3$, $CH(SiMe_3)_2$, or the like. Exemplary acrylate monomers including pendent silicon atoms are shown in formulas (7)-(14):

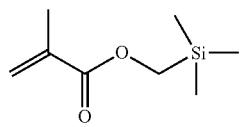
(7)

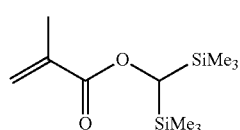
(8)

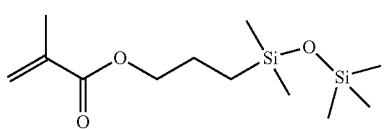
(9)

(10)
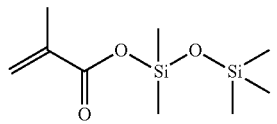

(11)
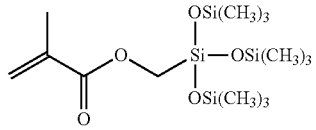

(12)
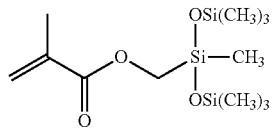

(13)
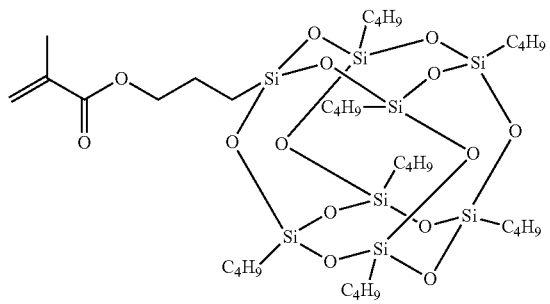

(14)
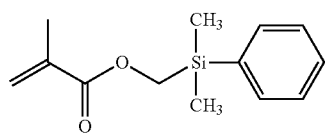

The smoothing component can also comprise polysiloxanes derived from a siloxane monomer and having a repeating unit with the structure of formula (15):

(15)
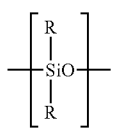

wherein each R is independently a $C_1$-$C_{10}$ alkyl, a $C_3$-$C_{10}$ cycloalkyl, a $C_6$-$C_{14}$ aryl, a $C_7$-$C_{13}$ alkylaryl or a $C_7$-$C_{13}$ arylalkyl. Combinations of the foregoing R groups can be present in the same monomer. Exemplary siloxanes include dimethylsiloxane, diethylsiloxane, diphenylsiloxanes, and combinations thereof.

The smoothing component and other optional units of the polymer, when present in the polymer, are typically present in an amount, for example, of from 0.01 to 100 mole %, from 50 to 99.99 mole %, from 80 to 99.9 mole %, or from 90 to 99.9 mole %, based on the polymer.

By selection of a suitable polymer, the thickness of the polymer on the patterned feature exposed surfaces can be accurately controlled. This thickness can be controlled, for example, by selection of a suitable molecular weight, with higher molecular weights typically resulting in greater thicknesses and lower molecular weights typically resulting in lesser thicknesses. The chemical composition of the polymer can also influence the amount of growth. For example, polymers with a longer unperturbed end-to-end distance or more rigid backbone can provide a larger shrink for a given molecular weight.

The polymer should have good solubility in an organic solvent used in the composition and an organic solvent used to rinse and completely remove excess polymer (i.e., polymer not attached to the resist pattern) from the substrate. The content of the polymer in the shrink compositions will depend, for example, on the desired coating thickness of the shrink composition. The polymer is typically present in the compositions in an amount of from 80 to 99 wt %, more typically from 90 to 98 wt %, based on total solids of the shrink composition. The weight average molecular weight of the polymer is typically less than 400,000, preferably from 1000 to 200,000, more preferably from 1000 to 150,000 or 2000 to 125,000 g/mol.

The polymer preferably has good etch resistance to facilitate pattern transfer to one or more underlying layer. For carbon based polymers, the "Ohnishi parameter" can generally be used as an indicator of etch resistance of a polymer (J. Electrochem Soc, 143, 130 (1983), H. Gokan, S. Esho and Y. Ohnishi). The Ohnishi parameter is used in general to indicate the carbon density of a polymer and is specifically determined by the equation described in Formula (16):

$$N/(NC-NO)=\text{Ohnishi parameter} \quad (16)$$

where N is the combined total number of carbon atoms, hydrogen atoms and oxygen atoms, NC is the number of carbon atoms, and NO is the number of oxygen atoms. The increase of the carbon density of a polymer per unit volume (i.e., the decrease of the Ohnishi parameter) improves the etching resistance thereof. The Ohnishi parameter for carbon-based polymers useful in the invention is typically less than 4.5, preferably less than 4, and more preferably less than 3.5. For polymers containing silicon and other etch resistant atoms, the Ohnishi parameter is incapable of predicting etch properties. For silicon-containing polymers, the etch resistance to oxygen plasma increases with increasing silicon content. Polymers high in silicon generally have high resistance to oxygen plasma reactive ion etching. Thus, silicon content is generally used as a means to predict etch properties. When high etch resistance is desired, the silicon content for silicon-containing polymers useful in the invention is typically greater than 10 wt %, preferably greater than 15 wt %, and more preferably greater than 20 wt %, greater than 25 wt % or greater than 30 wt %, based on the polymer.

Suitable copolymers useful in the pattern treatment compositions include, for example, the following, which may take the form of random polymers and/or block copolymers, with block copolymers being preferable:

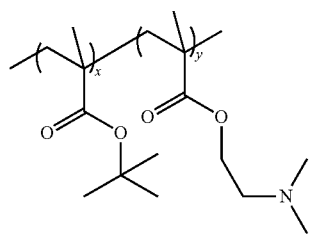

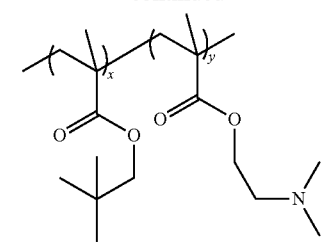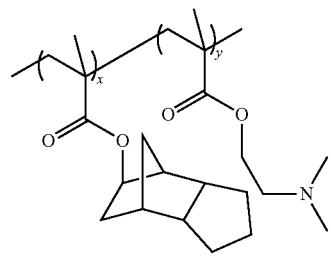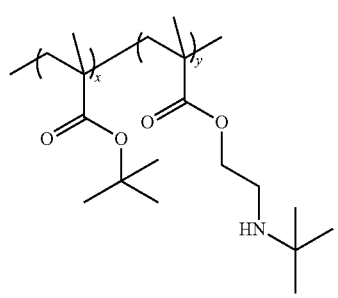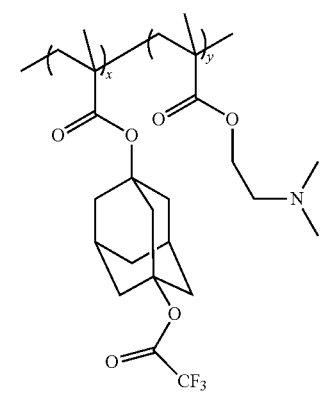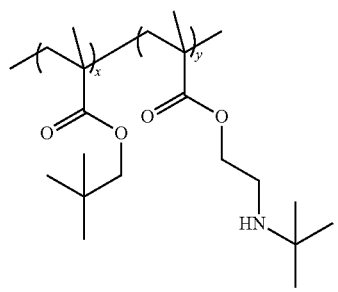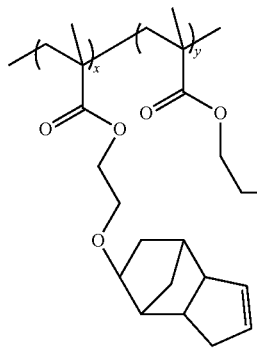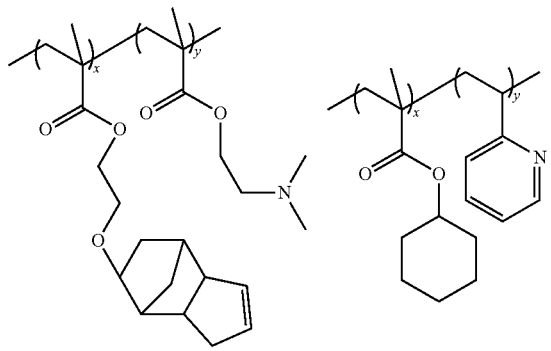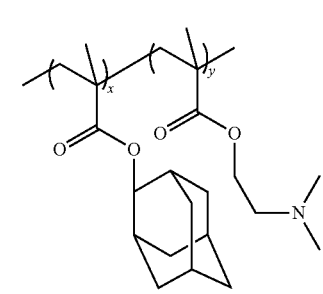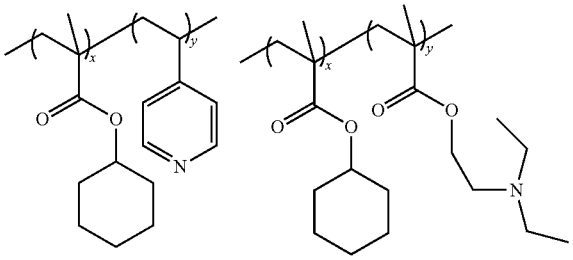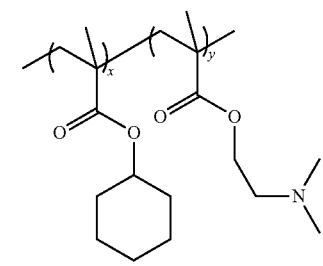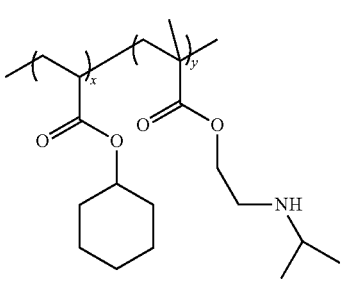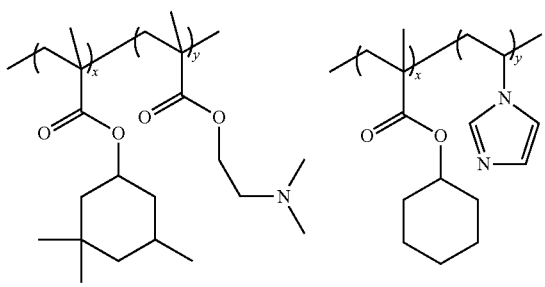

-continued
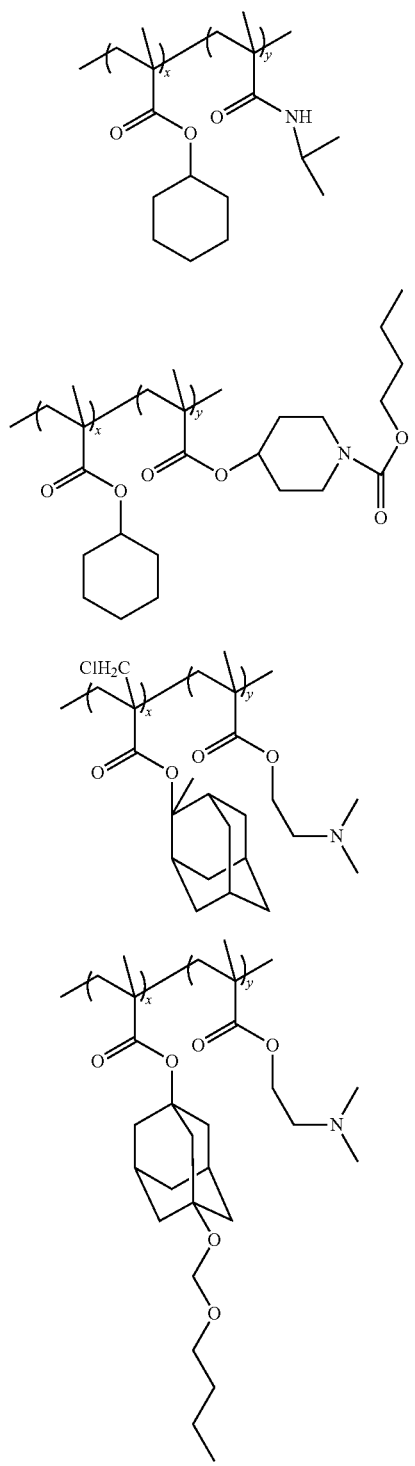
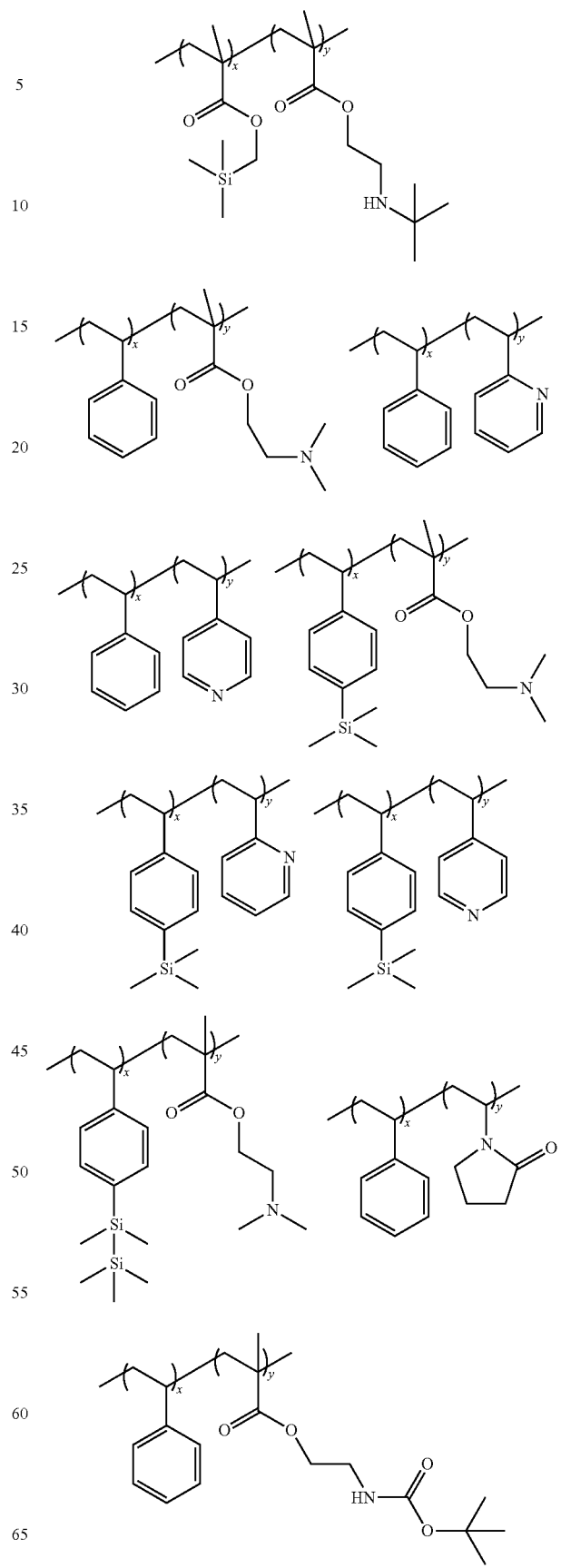

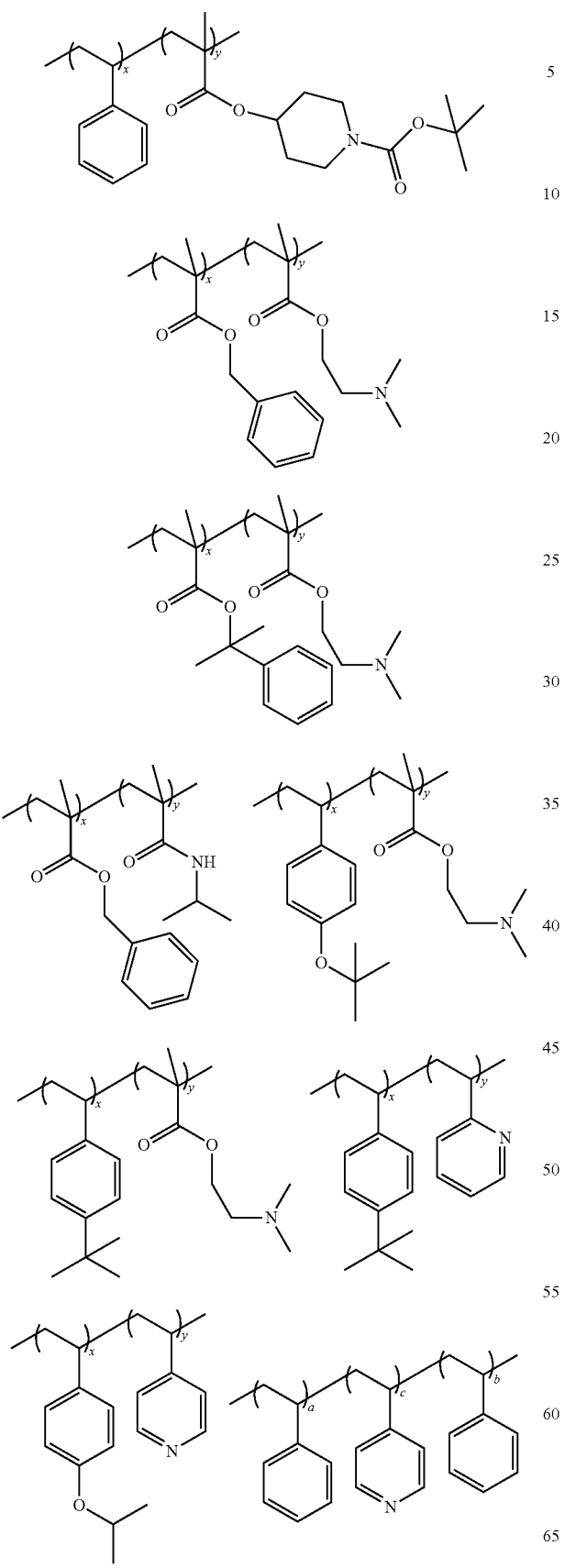
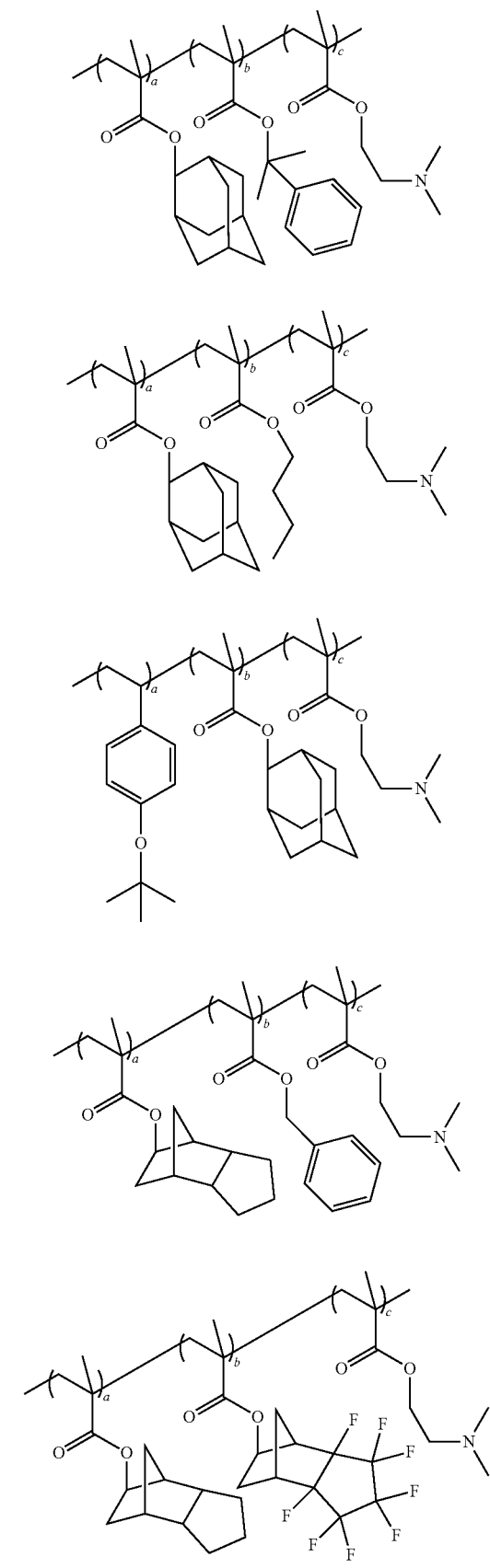

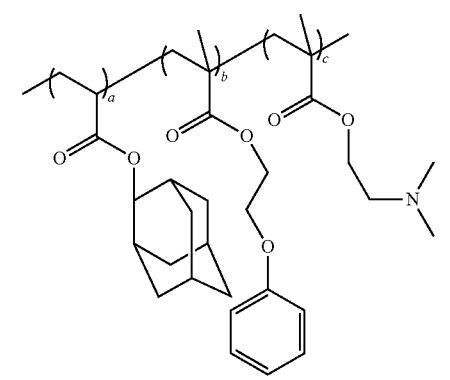
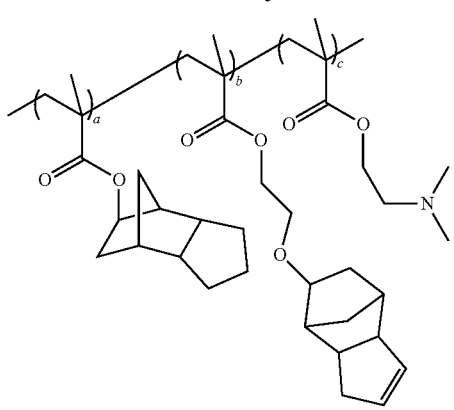
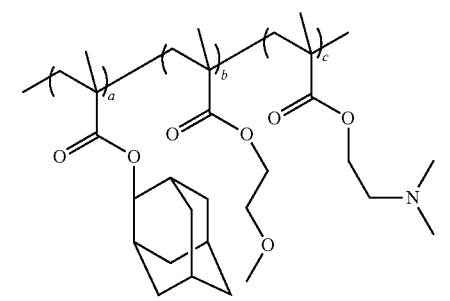
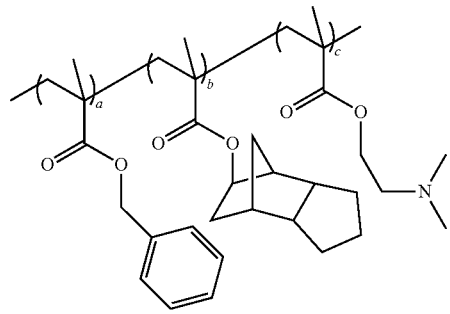
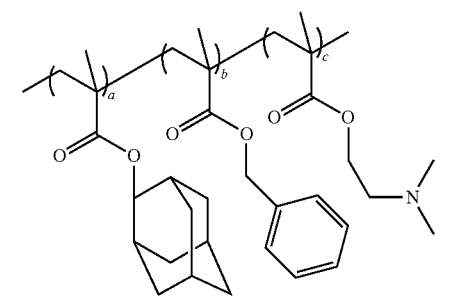
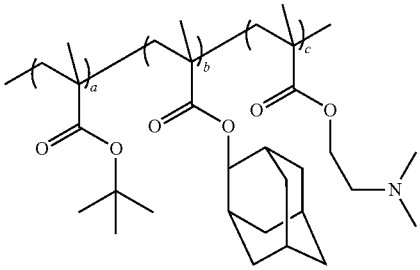
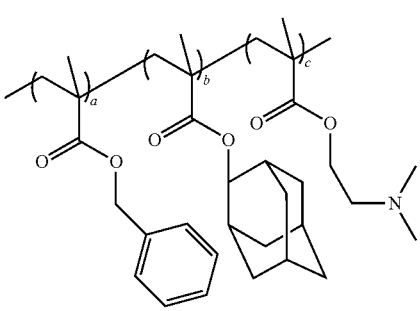
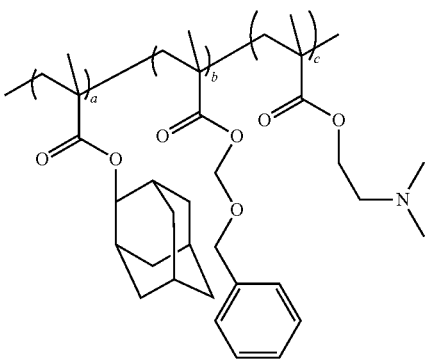
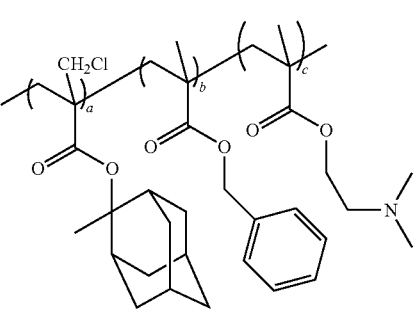
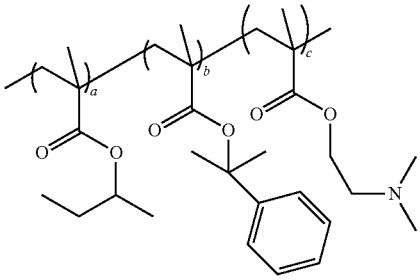

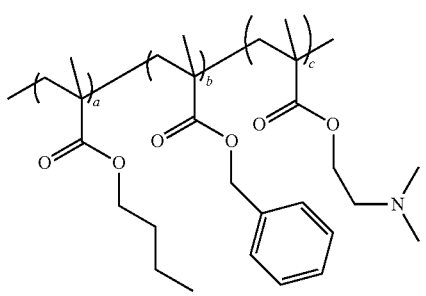
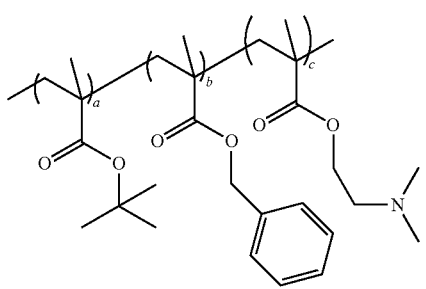
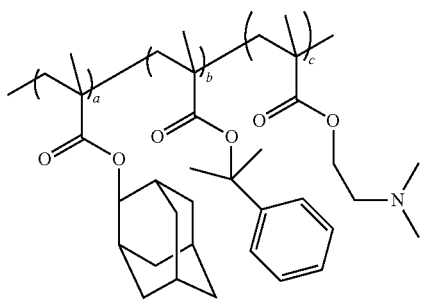
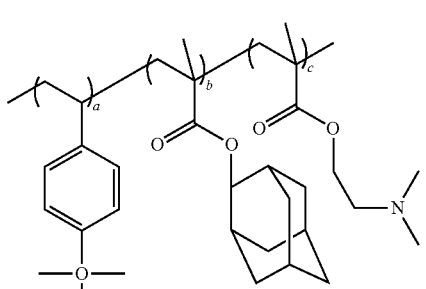
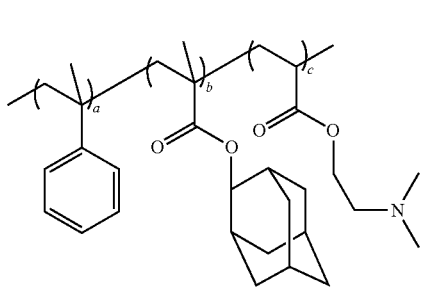
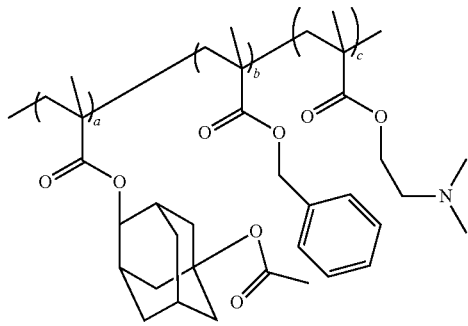
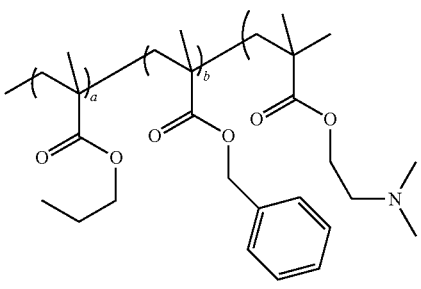
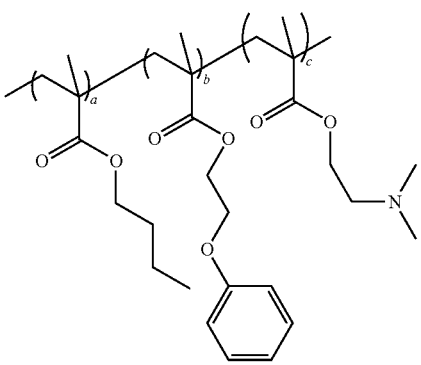
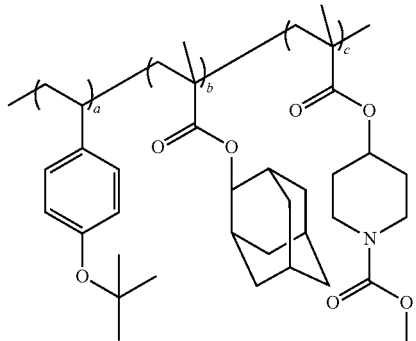
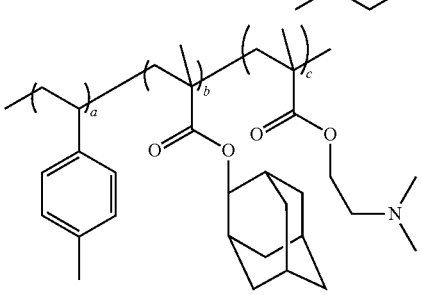

-continued
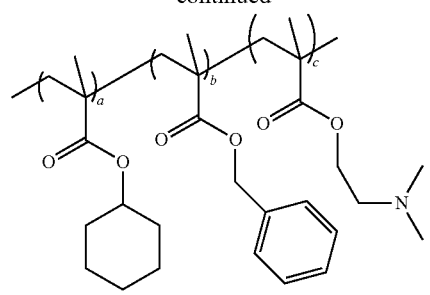
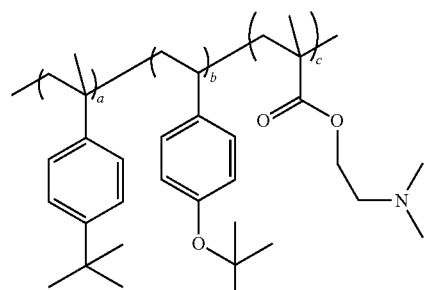
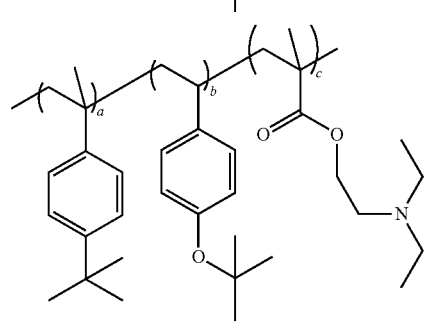
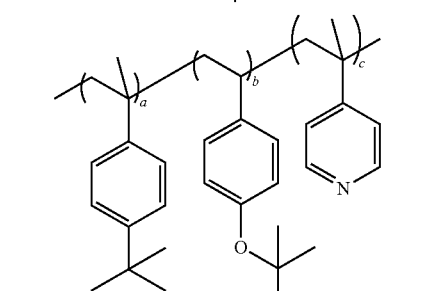
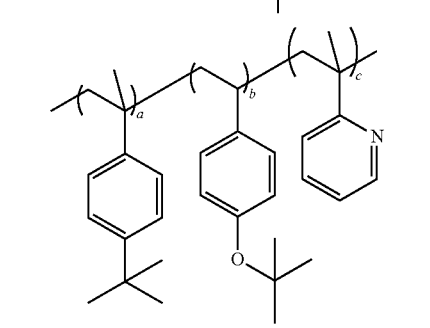
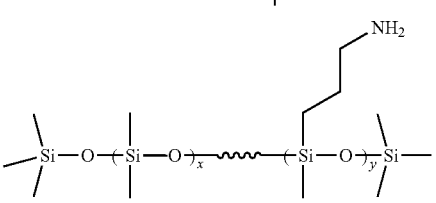
-continued
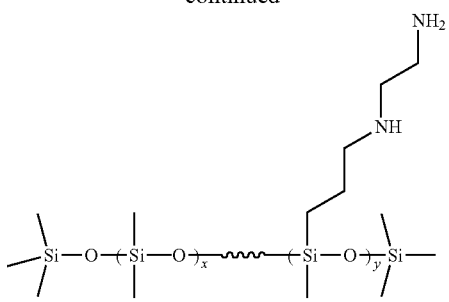
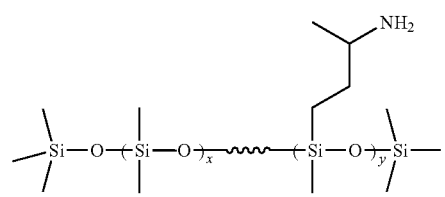
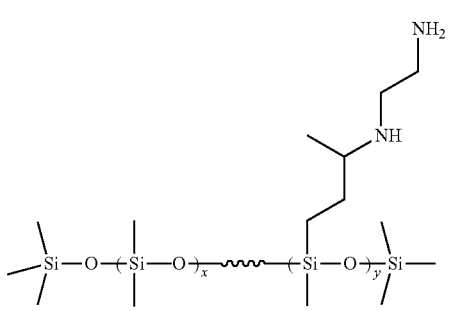
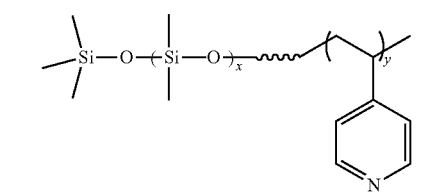
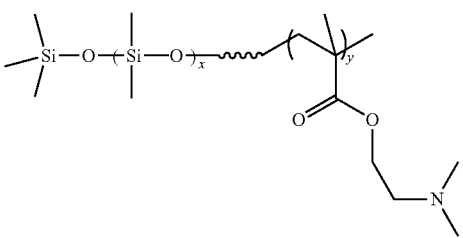
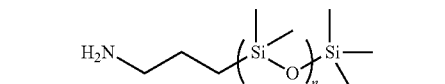
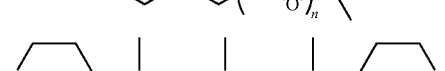
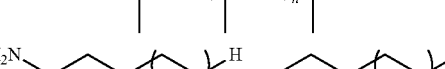
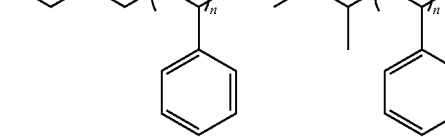

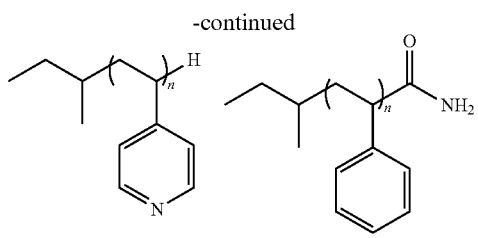

wherein: x is from 0.01 to 99.999 mole %, from 50 to 99.99 mole %, from 80 to 99.9 mole %, or from 90 to 99.9 mole %, based on the polymer; y is from 0.001 to less than 99.99 mole %, from 0.01 to 50 mole %, from 0.1 to 20 mole %, or from 0.1 to 10 mole %, based on the polymer; a and b are present in a combined amount of from 0.01 to 99.9 mole %, from 50 to 99.99 mole %, from 80 to 99.9 mole %, or from 90 to 99.9 mole %, based on the polymer; c is from 0.001 to less than 99.99 mole %, from 0.01 to 50 mole %, from 0.1 to 20 mole %, or from 0.1 to 10 mole %, based on the polymer; and n is and integer represent the number of units, for example, from 5 to 4000.

The pattern treatment compositions typically include a single polymer, but can optionally include one or more additional polymer as described above and/or other polymer. Suitable polymers for use in the pattern treatment compositions are commercially available and/or can readily be made by persons skilled in the art. The polymer can be subjected to purification prior to being combined with the other components of the pattern treatment composition for removal of metallic and/or non-metallic impurities. Purification can involve, for example, one or more of washing, slurrying, centrifugation, filtration, distillation, decantation, evaporation and treatment with ion exchange beads.

The pattern treatment compositions further include a solvent. The solvent is preferably an organic solvent in the form of a single organic solvent or a mixture of organic solvents. Suitable solvent materials to formulate and cast the pattern treatment compositions exhibit excellent solubility characteristics with respect to the non-solvent components of the compositions, but do not appreciably dissolve an underlying photoresist pattern. Suitable organic solvents for the pattern treatment compositions include, for example: alkyl esters such as n-butyl acetate, n-butyl propionate, n-pentyl propionate, n-hexyl propionate and n-heptyl propionate, and alkyl butyrates such as n-butyl butyrate, isobutyl butyrate and isobutyl isobutyrate; ketones such as 2-heptanone, 2,6-dimethyl-4-heptanone and 2,5-dimethyl-4-hexanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; toluene, anisole and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. The solvent component of the composition is typically present in an amount of from 90 to 99 wt % based on the total composition.

The pattern treatment compositions can include one or more optional additives including, for example, surfactants and antioxidants. Such optional additives if used are each typically present in the composition in minor amounts such as from 0.01 to 10 wt % based on total solids of the composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121, L123, L31, L81, L101 and P123 (BASF, Inc.).

An antioxidant can be added to prevent or minimize oxidation of organic materials in the pattern treatment composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl.hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butyl.anilino)2,4-bis.octyl-thio-1, 3,5-triazine, n-octadecyl-3-(4'-hydroxy-3',5'-di-tert-butyl-.phenyl)propionate, octylated phenol, aralkyl-substituted phenols, alkylated p-cresol and hindered phenol; bis-, tris- and poly-phenols such as 4,4'-dihydroxy.diphenyl, methylene.bis(dimethyl-4,6-phenol), 2,2'-methylene-bis-(4-methyl-6-tert-butylphenol), 2,2'-methylene-bis-(4-methyl-6-cyclohexyl.phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl.diphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methyl ene-3-(3',5'-di-tert-butyl-4'-hydroxyphenyl)propionate]methane.

Suitable antioxidants are commercially available, for example, Irganox™ antioxidants (Ciba Specialty Chemicals Corp.).

The pattern treatment composition is preferably free of crosslinkers such as typically used in acid diffusion resist growth processes. These processes are known to suffer from proximity and size bias, where, for example, isolated holes shrink more than dense holes due to the concentration of acid in the remaining photoresist. In addition to being free of crosslinkers, the pattern treatment compositions are preferably free of acids, acid generator compounds, for example, thermal acid generator compounds and photoacid generator compounds, as such compounds may limit the amount of trench/hole shrink achievable by the composition by competing with the acid/alcohol of the resist with the anchoring functionality of the composition.

The pattern treatment compositions can be prepared following known procedures. For example, the compositions can be prepared by dissolving the polymer and other optional solid components of the composition in the solvent components. The desired total solids content of the compositions will depend on factors such as the particular polymer(s) in the composition and desired final layer thickness. Preferably, the solids content of the pattern treatment compositions is from 1 to 10 wt %, more preferably from 1 to 5 wt %, based on the total weight of the composition.

Pattern Treatment Methods

Figure 2A:
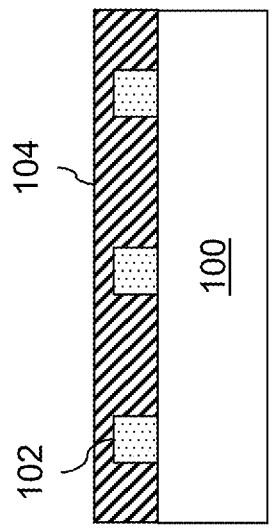
FIG. 2A-D shows in cross-section a substrate at various stages of pattern formation in accordance with the invention.

Processes in accordance with the invention will now be described with reference to FIG. 2A-D, which illustrates in cross section an exemplary process flow for treating a pattern in accordance with the invention. FIG. 2A illustrates a substrate 100 having a patterned feature 102 thereon. The substrate can include various layers and features formed on a surface thereof. The substrate can include a material such as a semiconductor, for example, silicon or a compound semiconductor (e.g., III-V or II-VI), glass, quartz, ceramic, copper and the like. Typically, the substrate is a semiconductor wafer, such as a silicon wafer, having one or more layers and/or features formed on a surface thereof.

The layers and features of the substrate can be formed, for example, from one or more of conductive materials such as aluminum, copper, molybdenum, tantalum, titanium, tungsten, alloys, nitrides or silicides of such metals, doped amorphous silicon or doped polysilicon, dielectric materials such as silicon oxide, silicon nitride, silicon oxynitride, or metal oxides, and semiconductor materials. The layers can be applied by various techniques, for example, one or more of CVD such as plasma-enhanced CVD (PECVD), low-pressure CVD (LPCVD) or epitaxial growth, atomic layer deposition (ALD), physical vapor deposition (PVD) such as sputtering or evaporation, electroplating, spin-coating or thermal oxidation. Where, a photoresist layer is to be coated and patterned to form patterned feature 102, the substrate typically includes a hardmask layer and/or a bottom antireflective coating (BARC) layer, over which the photoresist layer is coated. Use of a hardmask layer may be desired, for example, with very thin resist layers, where underlying layers to be etched require a significant etching depth, and/or where the particular etchant has poor resist selectivity.

Where a hardmask layer is used, the patterned feature 102 can be transferred to the hardmask layer which, in turn, can be used as a mask for etching an underlying layer. Suitable hardmask materials and formation methods are known in the art. Typical materials include, for example, tungsten, titanium, titanium nitride, titanium oxide, zirconium oxide, aluminum oxide, aluminum oxynitride, hafnium oxide, spin-on-carbon (SOC), silicon oxynitride and silicon nitride. The hardmask layer can include a single layer or a plurality of layers of different materials. The hardmask layer can be applied, for example, by CVD, PVD or spin-coating.

A BARC layer may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the photoresist layer is exposed to deep ultraviolet light (300 nm or less), for example, KrF excimer laser light (248 nm) or ArF excimer laser light (193 nm). The antireflective coating can comprise a single layer or a plurality of different layers, and can be of an organic or inorganic material. Suitable antireflective materials and methods of formation are known in the art. Antireflective materials are commercially available, for example, those sold under the AR™ trademark by Rohm and Haas Electronic Materials LLC (Marlborough, Mass. USA), such as AR™ 40A and AR™ 124 antireflectant materials.

The geometry of patterned feature 102 is not limited and can take the form, for example, of contact hole or line-space patterns having an initial critical dimension ($CD_i$). In the case of line-space patterns, a linewidth of from 30 to 200 nm and pitch of from 75 to 500 nm are typical. For contact hole patterns, a hole diameter of from 30 to 200 nm and pitch of from 75 to 500 nm are typical. The thickness of patterned feature is typically from 60 to 500 nm.

The material of patterned feature 102 should allow for the formation of a bond between its outer surfaces, i.e., sidewall and top surfaces, and the surface attachment group of the pattern treatment composition. The patterned feature may provide such bonding sites in its originally formed state or, alternatively, can be further treated to generate the bonding sites. The sites for bonding with the surface attachment groups can be, for example, one or more of acid (e.g., carboxyl), hydroxyl, silanol, silyl ether, zirconium ether, or hafnium ether groups, along exposed surfaces of the patterned feature 102. Suitable materials for use in forming patterned feature 102 include, for example, photoresist, silicon oxide, silicon nitride, silicon oxynitride, SOC, titanium nitride, hafnium oxide, and zirconium oxide materials. Of these, photoresist patterns are typical.

Suitable photoresist patterns can be formed from negative tone development (NTD) photoresist compositions. Photoresist compositions useful in the invention include, for example, chemically-amplified photoresist compositions comprising a matrix resin that is acid-sensitive, meaning that as part of a layer of the photoresist composition, the resin and composition layer undergo a change in solubility in an organic developer as a result of reaction with acid generated by a photoacid generator following soft bake, exposure to activating radiation and post exposure bake. The change in solubility is brought about when acid-cleavable leaving groups such as photoacid-labile ester or acetal groups in the matrix polymer undergo a photoacid-promoted deprotection reaction on exposure to activating radiation and heat treatment to produce an acid or an alcohol group. Suitable photoresists are described, for example, in US Patent Publications US20130115559A1, US20110294069A1, US20120064456A1, US20120288794A1, US20120171617A1, US20120219902A1 and US7998655B2.

The matrix polymers typically include, one or more acid labile groups, one or more of polar groups (e.g., lactone, hydroxy adamantyl, hydroxy vinyl naphthalene) and one or more non-polar groups (e.g., adamantyl). Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer. Suitable matrix polymers further include polymers that contain (alkyl)acrylate units, preferably including acid-labile (alkyl)acrylate units, such as t-butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Other suitable matrix polymers include, for example, those which contain polymerized units of a non-aromatic cyclic olefin (endocyclic double bond) such as an optionally substituted norbornene. Blends of two or more of the above-described matrix polymers can suitably be used in the photoresist compositions. For imaging at certain sub-200 nm wavelengths such as 193 nm, the matrix polymer is typically substantially free (e.g., less than 15 mole %) or completely free of phenyl, benzyl or other aromatic groups where such groups are highly absorbing of the radiation.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, the compositions can include one or more of actinic and contrast dyes, antistriation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases include, for example: linear and cyclic amides and derivatives thereof such as N,N-bis(2-hydroxyethyl)pivalamide, N,N-Diethyl acetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2''-(ethane-1,2-diylbis(azanetriyl))tetraethanol, and 2-(dibutylamino)ethanol, 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is typically used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

The photoresist composition is coated on the substrate surface, typically by spin-coating, to form a photoresist layer. The photoresist layer is typically softbaked to minimize solvent content in the layer and then exposed to activating radiation through a patterned photomask and baked to create a difference in solubility between exposed and unexposed regions. The photoresist layer is then developed to remove unexposed regions of the layer. The NTD method typically makes use of an organic solvent developer, for example, a solvent chosen from ketones, esters, ethers, hydrocarbons, and mixtures thereof. Carboxylic acid groups and/or alcohol groups are typically present on the external surfaces of the patterned feature, and can serve as bonding sites for the surface attachment groups.

Figure 2B:
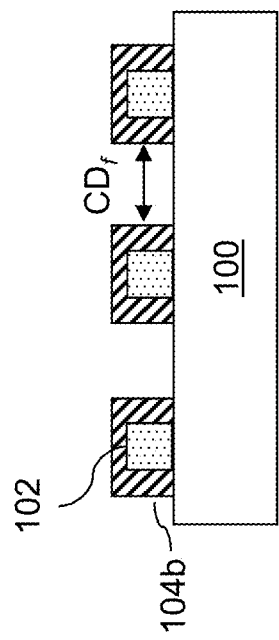

With reference to FIG. 2B, a pattern treatment composition as described herein is coated over the patterned feature 102 to form a pattern treatment composition layer 104. The pattern treatment composition is typically coated with a spin-coating tool. Depending on the particular process, the pattern treatment composition can be applied so as to cover the patterned feature 102 entirely or to a height less than or equal to the thickness of the patterned feature so as not to cover the resist pattern top surface, depending on the particular application. Not covering the top surface of the patterned feature may be desired in applications in which it is disadvantageous to have polymer bonded to the top surface of the patterned feature 102. Typically, the pattern treatment composition covers the patterned feature, as illustrated. The thickness of the pattern treatment composition will depend on the thickness of the patterned feature 102, but is typically from 30 to 500 nm, for example, from 40 to 200 nm, in thickness.

The pattern treatment composition layer 104 is typically next soft baked to remove solvent from the composition and to cause the polymer to diffuse and induce bonding between the surface attachment group of the polymer and the bonding sites of the patterned feature. A typical soft bake for the pattern treatment composition is conducted at a temperature of from about 90 to 150° C., and a time of from about 30 to 120 seconds. This softbake is typically conducted on a hotplate of the same coating tool used for coating of the pattern treatment composition.

Figure 2C:
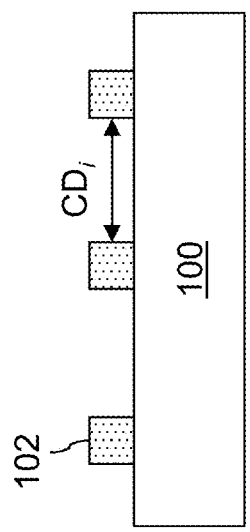

Residual pattern treatment composition including unbound polymer is next removed from the substrate by rinsing with a first rinse agent, leaving a layer 104a of the polymer bonded to the patterned feature 102 as shown in FIG. 2C. This rinse process is typically conducted by dispensing the first rinse agent over the substrate, for example, with a spin-coater tool. The same process tool used for coating the pattern treatment composition is typically used for rinsing the substrate with the first rinse agent. Suitable first rinse agents include a solvent component in which the residual (unbound) pattern treatment composition polymer exhibits good solubility. This will allow for substantial or complete removal of the residual polymer from the substrate surface, the presence of which residual polymer could otherwise cause defects such as patterning defects. The polymer bonded to the patterned feature is typically not removed by the first rinse agent but may become swollen during the first rinse. The solubility of the unbound polymer in the first rinse agent is typically greater than 0.01 g/g, preferably greater than 0.05 g/g and more preferably greater than 0.1 g/g (gram unbound polymer/gram first rinse agent). Polymer solubility as used herein is measured at room temperature. Suitable rinsing materials for the first rinse agent will depend on the pattern treatment composition polymer and include, for example, the same solvents described herein for use in the pattern treatment compositions, water or an aqueous solution. The same solvent employed for the particular pattern treatment composition can thus advantageously be used for the first rinse agent. The solvent component of the first rinse agent is typically present in an amount of from 95 to 100 wt % based on the total weight of the first rinse agent.

The first rinse agent may include one or more optional additives including, for example, a surfactant such as described with respect to the pattern treatment compositions. Such optional additives if used are each typically present in the first rinse agent in minor amounts such as from 0.001 to 5 wt % based on total weight of the first rinse agent.

The substrate can optionally next be baked to remove residual solvent that may be present on the substrate from the first rinse agent. Such bake if used is typically conducted at a temperature of from about 90 to 150° C., and a time of from about 30 to 120 seconds. This bake can be conducted on a hotplate on the same tool used for coating of the pattern treatment composition and for application of the first rinse agent.

The resulting polymer layer 104a may include a footing layer 106 formed on the substrate surface. Without wishing to be bound by any particular theory, it is believed that footing of the bound polymer can result from bonding of the polymer to the substrate surface in regions not covered by patterned feature 102, and wetting of the polymer that is bound to sidewalls of the patterned feature onto the polymer bonded to the substrate surface. Since the relatively good solvent of the first rinse agent makes contact with, not only ungrafted polymers, but also grafted polymers, it is believed that chain expansion in the presence of the good solvent is responsible for heavy footing. The presence of such a footing layer if left untreated can result in patterning defects such as bridging defects or missing contact holes.

For purposes of minimizing or eliminating the footing layer, the substrate is next rinsed with a second rinse agent that is different from the first rinse agent. This rinse process is typically conducted in a similar manner to the first rinse described above using a a spin-coater tool. The same process tool used for coating the pattern treatment composition and the first rinse agent is typically used for rinsing the substrate with the second rinse agent. The composition of the first rinse agent and second rinse agent are typically conducted sequentially. Optionally, the first rinse agent can be gradiently changed to the composition of the second rinse agent in a continuous process.

Figure 2D:
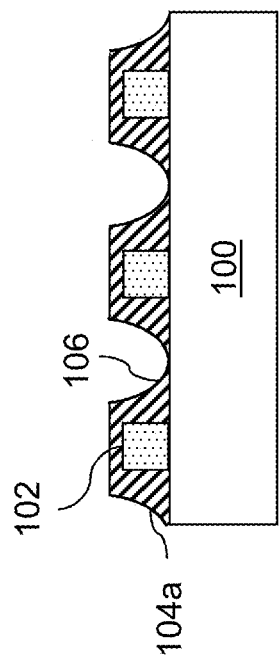

Suitable second rinse agents include a solvent component in which the pattern treatment composition polymer, in its unbound and pattern-bound form, exhibits a poor solubility relative to the first rinse agent. The solubility of the polymer in the first rinse agent is thus greater than that in the second rinse agent. Without wishing to be bound by any particular theory, it is believed that the relatively poor solubility of the bound polymer in the second rinse agent causes the polymer chains to collapse and establish a vertical profile. As shown in FIG. 2D, footing of the polymer-coated patterned feature can be reduced or eliminated following rinsing with the second rinse agent relative to footing of the polymer-coated patterned feature prior to rinsing with the second rinse agent. The solubility of the unbound pattern treatment composition polymer in the second rinse agent is typically less than 0.05 g/g, preferably less than 0.01 g/g and more preferably less than 0.001 g/g (gram unbound polymer/gram second rinse agent). The unbound pattern treatment composition polymer is preferably insoluble in the second rinse agent. The ratio of the solubility of the polymer in the first rinse agent to that in the second rinse agent is preferably greater than 5:1, more preferably greater than 10:1 typically from 5:0 to 100:0, more preferably from 10:0 to 100:0.

Typical suitable solvents for the second rinse agent include, for example, one or more of: alcohols such as $C_3$ to $C_{10}$ alcohols such as n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol; ether compounds such as $C_8$ to $C_{12}$ ethers such as di-n-butyl ether, diisobutyl ether, di-sec-butyl ether, di-n-pentyl ether, diisopentyl ether, di-sec-pentyl ether, di-tert-amyl ether, and di-n-hexyl ether; alkanes such as hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane; alkenes such as hexene, heptene, octene, cyclohexene, methylcyclohexene, dimethylcyclohexene, cycloheptene, and cyclooctene; and alkynes such as $C_6$ to $C_{12}$ alkynes; and aromatic solvents such as toluene, xylene, ethylbenzene, isopropylbenzene, tert-butylbenzene and mesitylene. Of these, heptane, isoamyl ether and decane are typical. The solvents may be used alone or in combinations thereof.

The solvent component of the second rinse agent is typically present in an amount of from 95 to 100 wt % based on the total weight of the second rinse agent. The second rinse agent may include one or more optional additives including, for example, a surfactant such as described with respect to the pattern treatment compositions. Such optional additives if used are each typically present in the second rinse agent in minor amounts such as from 0.001 to 5 wt % based on total weight of the second rinse agent.

Suitable combinations of first and second rinse agents include, for example, the following: n-butyl acetate and heptane; n-butyl acetate and isoamyl ether; n-butylacetate and methyl isobutyl carbinol; n-butyl acetate and an isoamyl ether/methyl isobutylcarbinol mixture (e.g., 50/50 volume ratio); n-butyl acetate and isopropanol; 2-heptanone and heptane; 2-heptanone and isoamyl ether; 2-heptanone and methyl isobutyl carbinol; 2-heptanone and an isoamyl ether/methyl isobutylcarbinol mixture (e.g., 50/50 volume ratio); 2-heptanone and isopropanol; PGMEA and heptane; PGMEA and isoamyl ether; PGMEA and methyl isobutyl carbinol; PGMEA and an isoamyl ether/methyl isobutylcarbinol mixture (e.g., 50/50 volume ratio); and PGMEA and isopropanol.

Following treatment with the first and second rinse agents, the effective thickness of the patterned feature sidewalls is increased, thereby reducing the spacing between adjacent lines or within a trench or hole pattern. The resulting polymer coating 104b is substantially evenly coated over the patterned feature 102 and has a final critical dimension ($CD_f$) that is less than that of the initial CD. The polymer coating 104b over the patterned feature 102 also typically has an improved (i.e., reduced) surface roughness as compared with that of the patterned feature 102.

The substrate can optionally next be baked to remove residual solvent that may be present on the substrate from the second rinse agent. Optionally, a bake can be conducted at a temperature above the $T_g$ of the bonded polymer. This bake can provide beneficial results, for example, in the form of improved pattern roughness or circularity due to the thermodynamic drive of the polymer to minimize its interfacial area with air. Such bake if used is typically conducted at a temperature of from about 90 to 150° C., and a time of from about 30 to 120 seconds. Such baking can be conducted on a hotplate on the same tool used for coating of the pattern treatment composition and for application of the first and second rinse agents.

Figure 3A:
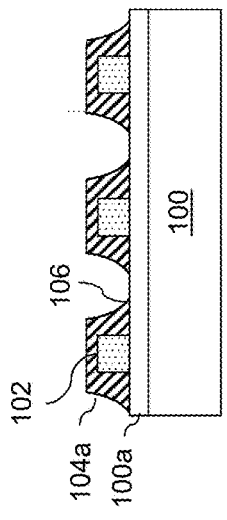
FIG. 3A-F shows in cross-section a substrate at various stages of pattern formation in accordance with the invention.
Figure 3B:
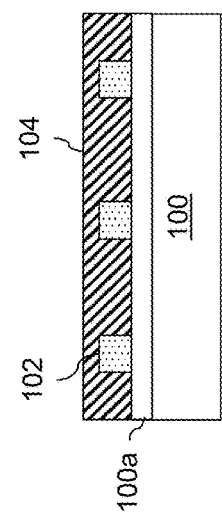
Figure 3C:
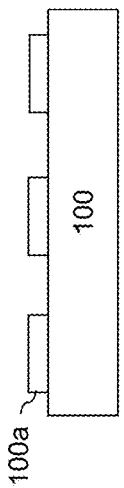
Figure 3D:
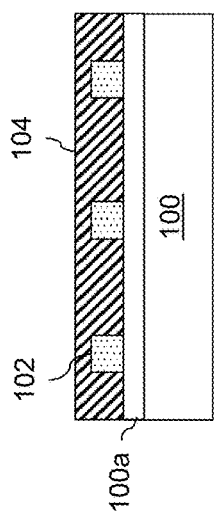
Figure 3E:
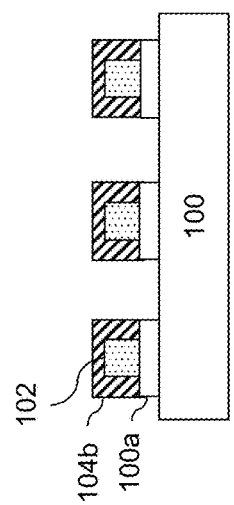
Figure 3F:
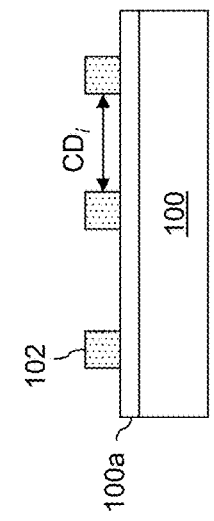
Figures 4A, 4B, 4C:
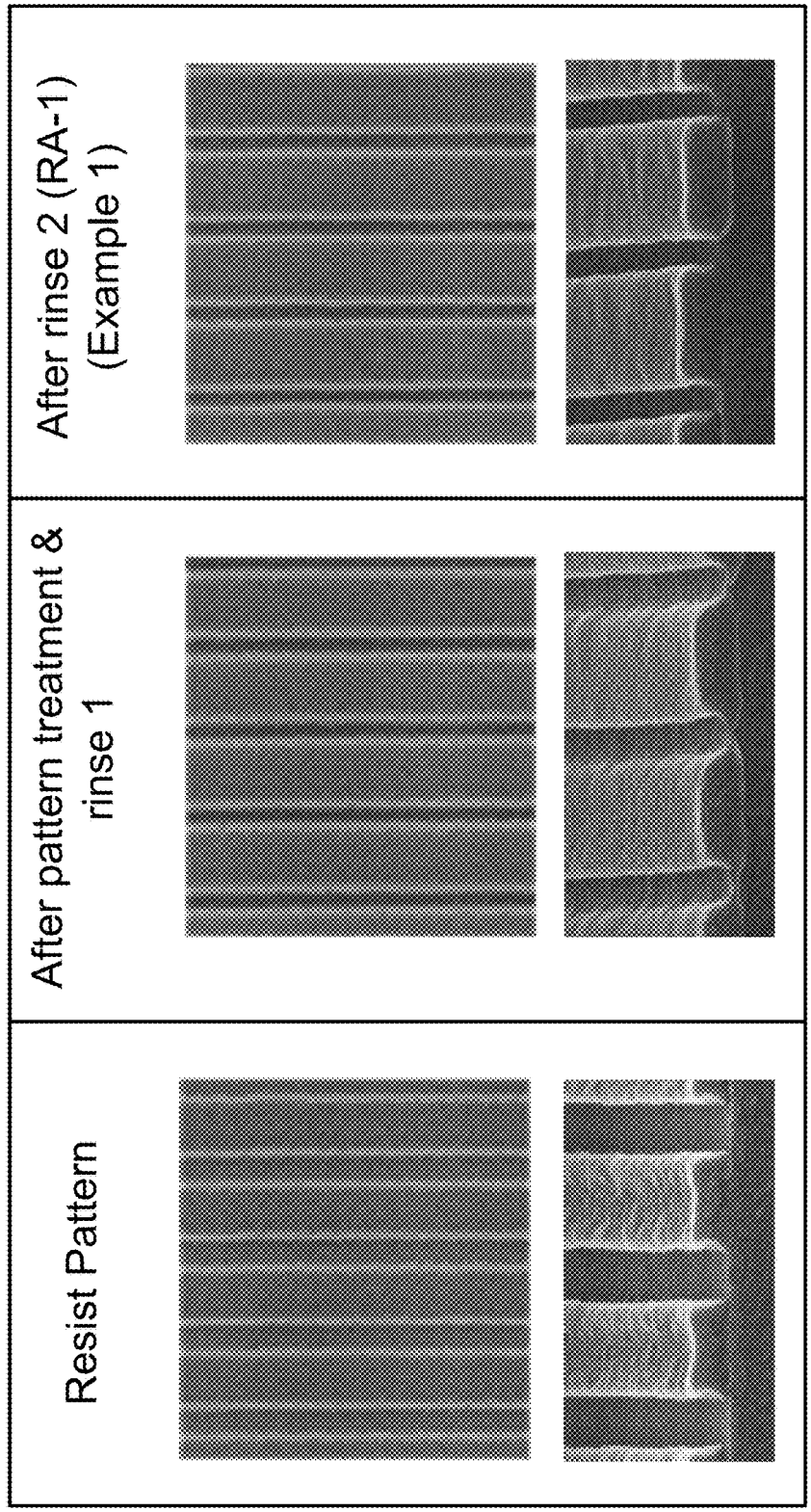
FIGS. 4A-C, 5A-D and 6A-E show SEM photomicrographs of patterns at various stages of formation in accordance with the invention.
Figures 5A, 5B, 5C, 5D:
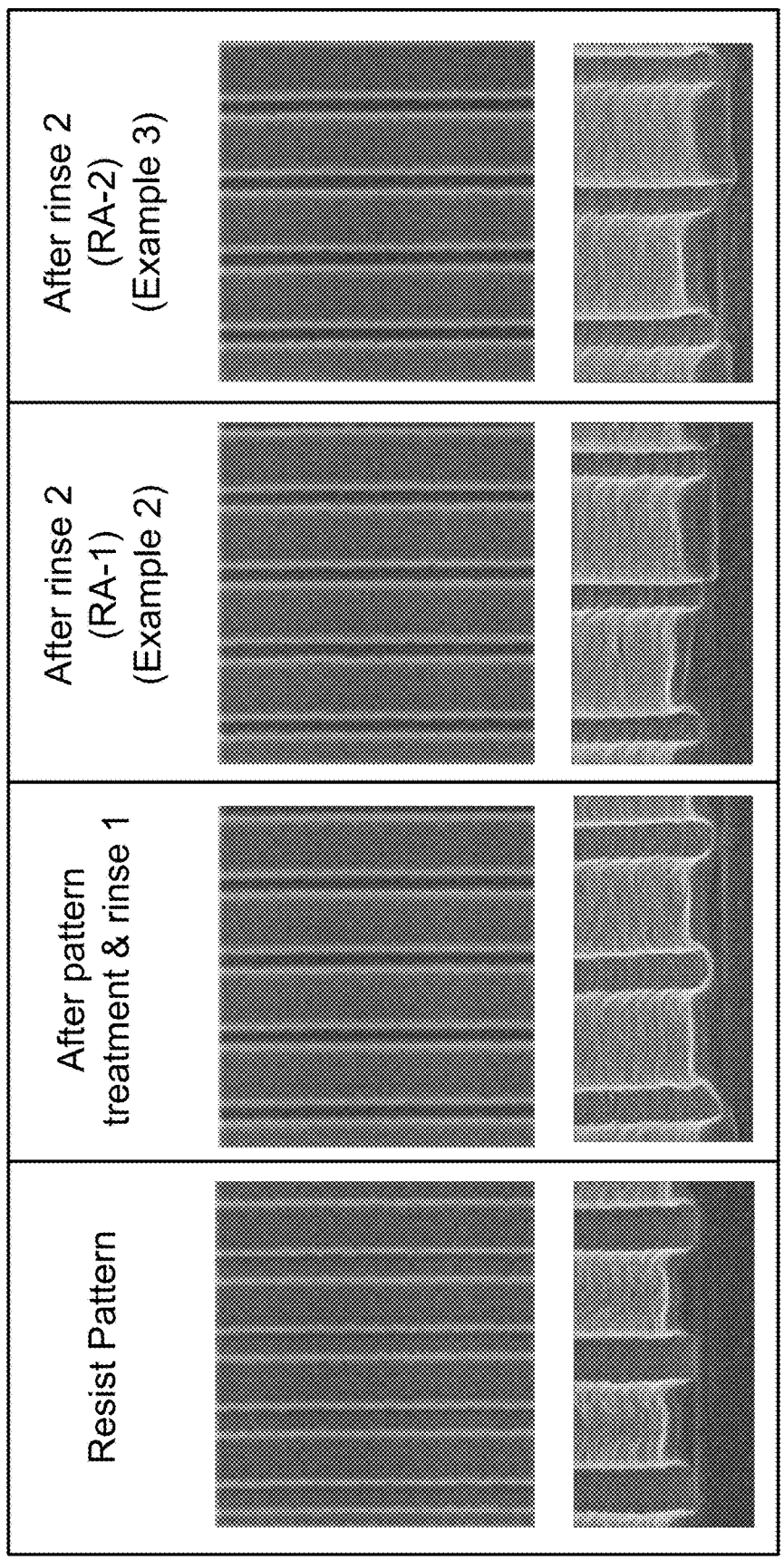
Figures 6A, 6B, 6C, 6D, 6E:
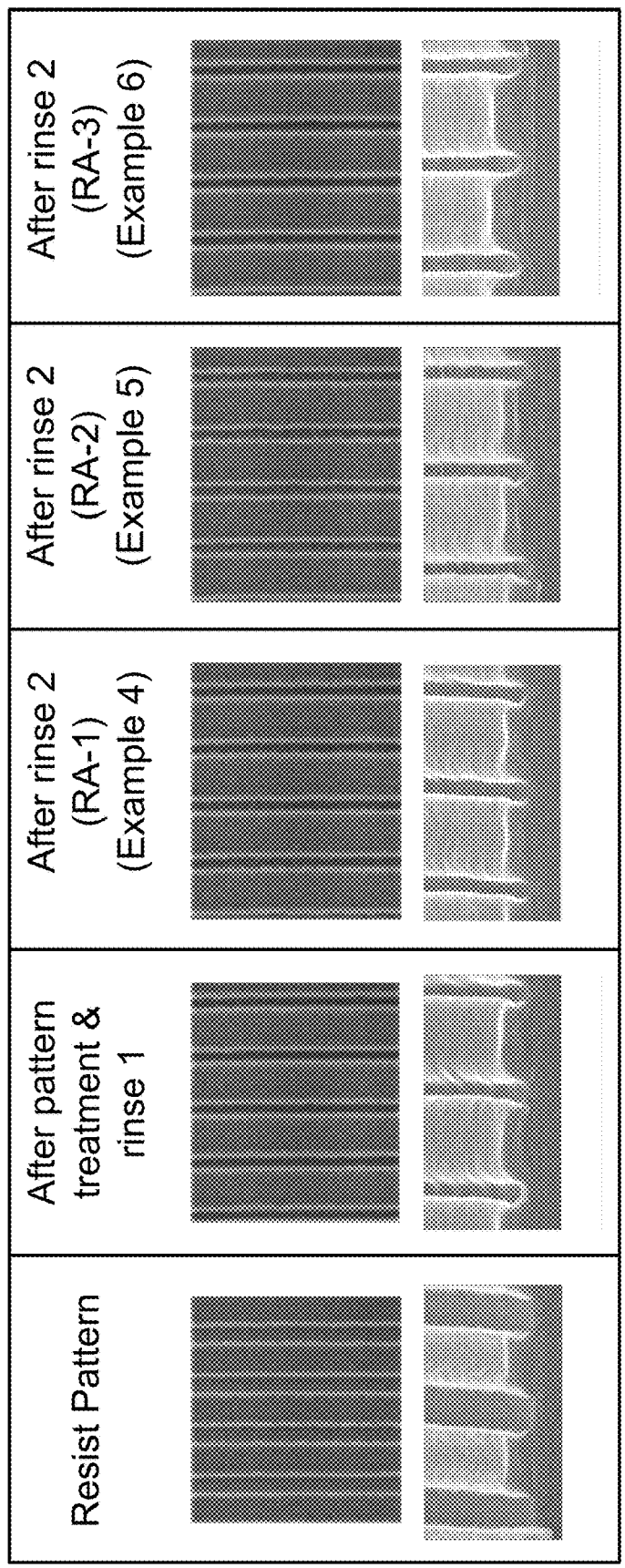

The substrate 100 can be further processed to form a finished device. Additional processes can include, for example, one or more of etching, coating, ion implantation or photolithography processes. Exemplary further processing of the substrate is illustrated FIG. 3A-F, wherein the process described above with respect to FIG. 2A-D is applicable to FIG. 3A-D except where otherwise indicated. In the illustrated process flow, the polymer-coated patterned feature is used as an etching mask to pattern one or more layer 100a of the substrate. In this aspect, the patterned feature is typically a photoresist pattern such as formed by a PTD or NTD process, or a hardmask material such as a silicon oxide, silicon nitride, silicon oxynitride or a spin-on-carbon hardmask pattern. The one or more layer to be patterned 100a can next be selectively etched using the polymer-coated patterned feature 102, 104b as an etch mask to expose the underlying substrate 100 as shown in FIG. 3E. Suitable etching techniques and chemistries for etching layer 100a are known in the art, with dry-etching processes such as reactive ion etching being typical. The bonded polymer 104b and patterned feature 102 can next be removed from the substrate using known dry-etching or stripping techniques, as shown in FIG. 3F.

The following non-limiting examples are illustrative of the invention.

EXAMPLES

Number and weight-average molecular weights, Mn and Mw, and polydispersity (PDI) values (Mw/Mn) for the non-nitrogen-containing block polymers were measured by gel permeation chromatography (GPC) on a Waters alliance system equipped with a refractive index detector. Samples were dissolved in HPCL grade THF at a concentration of approximately 1 mg/mL and injected through four Shodex columns (KF805, KF804, KF803 and KF802). A flow rate of 1 mL/min and temperature of 35° C. were maintained. The columns were calibrated with narrow molecular weight PS standards (EasiCal PS-2, Polymer Laboratories, Inc.). For the nitrogen-containing block on the final block copolymers, the number average molecular weights Mn were calculated based on reactant feed charges.

Top-down scanning electron micrographs were generated with a Hitachi 59380 SEM at 250 K magnification. Cross-section SEM images were generated with an Amray 1910 scanning electron microscope after sectioning the wafers. Critical dimension (CD), pitch and the presence of footing were determined based on the SEM images.

Photoresist Composition Preparation 17.73 g Matrix Polymer A (15 wt % in PGMEA), 16.312 g PAG A solution (1 wt % in methyl-2-hydroxy isobutyrate), 3.463 g PAG B solution (1 wt % in PGMEA), 6.986 g PAG C solution (2 wt % in methyl-2-hydroxyisobutyrate), 4.185 g trioctylamine (1 wt % solution in PGMEA), 0.248 g Polymer Additive A (25 wt % solution in PGMEA), 25.63 g PGMEA, 9.69 g gamma-butyrolactone and 22.61 g methyl-2-hydroxyisobutyrate were mixed and filtered through a 0.2 μm Nylon filter to form Photoresist Composition PRC-1.

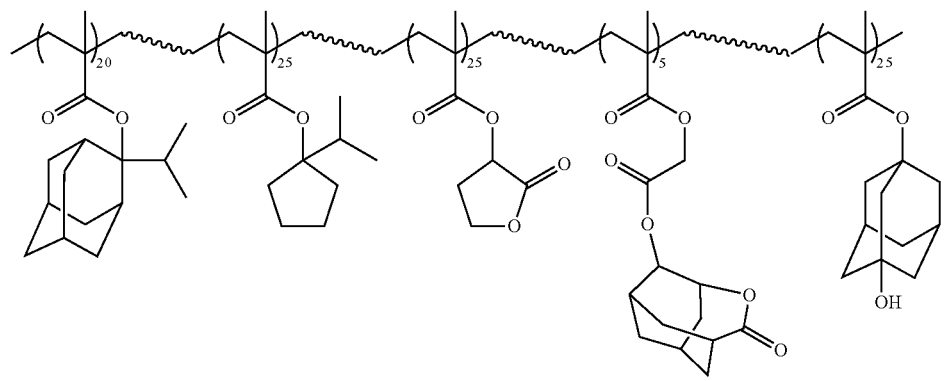

Matrix Polymer A

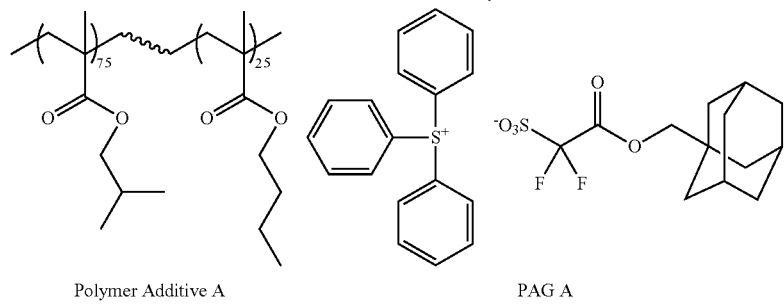

Polymer Additive A          PAG A

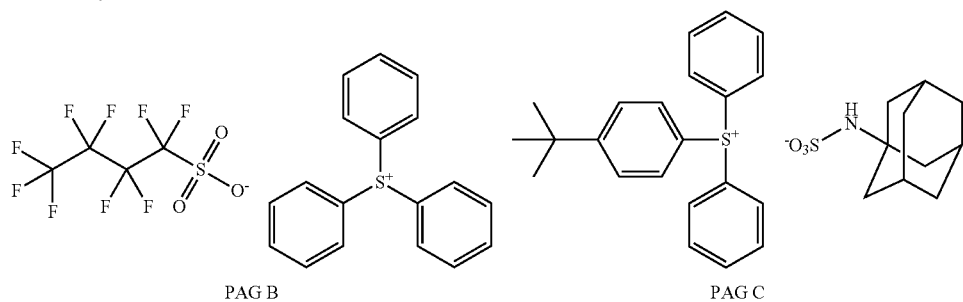

PAG B                       PAG C

Pattern Treatment Polymer Preparation
Preparation of Polymers P-1 and P-2

Polymers P-1 and P-2 were synthesized by anionic polymerization using the materials and amounts set forth in Table 1. Cyclohexyl methacrylate (CHMA), dimethylaminoethyl methacrylate (DMAEMA) and tetrahydrofuran (THF) were freeze-pump-thawed three times to remove oxygen. The monomers were further purified prior to use with activated $Al_2O_3$ and were diluted with cyclohexane to about 50 vol % concentration. An amount of THF required for a reaction concentration of about 7-10 wt % solids was transferred to a reactor containing pre-dried lithium chloride (LiCl). The contents were cooled to −78° C. in a dry ice/isopropanol bath. The THF was titrated with 0.7 M sec-butyl lithium (SBL) initiator in cyclohexane until a green color was observed. The reaction bath was warmed to room temperature until the green color fully disappeared. The reaction bath was again cooled to −78° C. followed by addition of diphenyl ethylene (DPE) and SBL initiator to yield a bright red color. CHMA was fed to the reactor and the contents were stirred for four hours. A reaction aliquot was collected by cannulating the polymer mixture in oxygen-free methanol. The precipitated polymer was analyzed by GPC for Mn. DMAEMA was added to the reactor and the mixture was stirred for two hours at −78° C. The reaction was then quenched by addition of oxygen-free methanol. The reaction product was precipitated out in methanol to yield a powdery white precipitate which was vacuum-dried in an oven at 50° C. for eight hours to yield a dry polymer as Polymer P-1 or P-2 having the structures shown below:

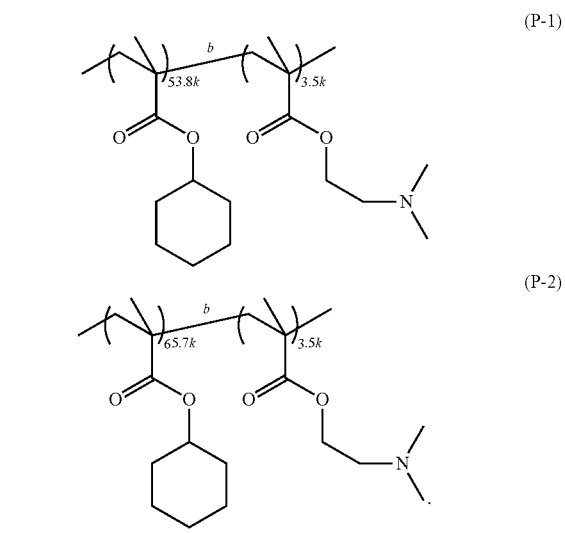

Preparation of Polymer P-3

Polymer P-3 was synthesized by anionic polymerization using the materials and amounts set forth in Table 1. 4-vinyl pyridine was distilled from calcium hydride before use and THF was passed through an $Al_2O_3$ column before use. Styrene and 4-vinyl pyridine monomers were purified prior to use with activated $Al_2O_3$ and diluted with cyclohexane to about 50 vol % concentration. The monomer solutions were further degassed with ultrahigh purity Argon before polymerization. An amount of THF required for a reaction concentration of about 7-10 wt % solids was transferred to a reactor. The contents were cooled to $-78°$ C. in a dry ice/isopropanol bath. The THF was titrated with sec-butyl lithium (SBL) initiator in 0.7 M cyclohexane until a green color was observed. The reaction bath was warmed to room temperature until the green color fully disappeared. The reaction bath was again cooled to $-78°$ C. followed by addition of SBL initiator. Styrene (224.40 g) was slowly fed to the reactor and the contents were stirred for an additional one hour. A reaction aliquot was collected by cannulating the polymer mixture into oxygen-free methanol. The precipitated polymer was analyzed by GPC for Mn. 4-vinylpyridine (15.77 g) was added to the reactor and the mixture was stirred for one hour at $-78°$ C. The reaction product was precipitated out in 10 L of methanol/water mixture (60/40 by volume) to yield a powdery white precipitate. The precipitate is filtered and slurried with deionized water for another 3 hour. After another filtrate, the final product was vacuum-dried in an oven at $60°$ C. for eight hours to yield a dry polymer as Polymer P-3 having the structure shown below:

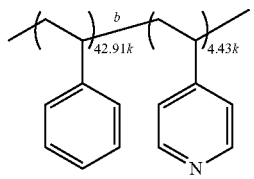

(P-3)

TABLE 1

| Polymer | Monomer A | Monomer B | LiCl | Mn | PDI | Mn Target | SBL | DPE |
|---|---|---|---|---|---|---|---|---|
| P-1 | M1 (239.50 g) | M2 (10.48 g) | 1.27 | 58.3k | 1.08 | 3.5k | 8.09 mL (0.370M) | 1.11 g |
| P-2 | M1 (191.61 g) | M2 (8.38 g) | 5.57 | 65.7k | 1.03 | 3.5k | 5.57 ml (0.43M) | 0.65 g |
| P-3 | M3 (224.4 g) | M4 (15.77 g) | — | 42.91 | 1.12 | 3.5k | 9.97 mL (0.52M) | — |

M1 = cyclohexyl methacrylate (CHMA); M2 = dimethylaminoethyl methacrylate (DMAEMA); M3 = styrene; M4 = 4-vinylpyridine; Mn = Mn for Monomer A-containing block; PDI = PDI for Monomer A-containing block; Mn Target = Mn for Monomer B-containing block calculated based on reactant feed charges; SBL = sec-butyl lithium in cyclohexane; DPE = diphenyl ethylene.

Pattern Treatment Polymer Solubility Evaluation

Solubility of pattern treatment polymers PTP-1 and PTP-3 in various rinse agents was tested by adding the polymers into respective rinse agents in various amounts from 0.1 to 10 wt % (based on the rinse agent and polymer) to form 12 g samples. Visual inspection of the solutions was performed after shaking for 12 hours to determine whether dissolution of the polymers occurred. For samples in which the polymer appeared completely dissolved, solution turbidity was measured using an Orbeco-Hellige TB300-IR Lab Turbidimeter. Polymer having a turbidity of 1 NTU or less in a particular solvent was considered soluble. The results are shown in Table 2. Solubility of Polymer P-2 was not evaluated for solubility, but would be expected to have substantially the same solubility characteristics as Polymer P-1.

TABLE 2

| | | wt % polymer in rinse agent/turbidity (NTU) | | | | |
|---|---|---|---|---|---|---|
| Polymer | Solvent | 0.1 wt % | 0.5 wt % | 2 wt % | 5 wt % | 10 wt % |
| P-1 | nBA | * | * | 0.7 | 1.0 | 1.6 |
| P-1 | 2-heptanone | * | * | 0.3 | 0.5 | 1.3 |
| P-1 | Heptane | Insoluble** | Insoluble** | Insoluble** | Insoluble** | Insoluble** |
| P-1 | 4M2P | Insoluble** | Insoluble** | Insoluble** | Insoluble** | Insoluble** |
| P-1 | IAE | Insoluble** | Insoluble** | Insoluble** | Insoluble** | Insoluble** |
| P-3 | nBA | * | * | 1.1 | 2.4 | 2.3 |
| P-3 | 2-heptanone | * | * | 0.6 | 1.0 | 1.3 |
| P-3 | Heptane | Insoluble** | Insoluble** | Insoluble** | Insoluble** | Insoluble** |

TABLE 2-continued

| | | wt % polymer in rinse agent/turbidity (NTU) | | | | |
|---|---|---|---|---|---|---|
| Polymer | Solvent | 0.1 wt % | 0.5 wt % | 2 wt % | 5 wt % | 10 wt % |
| P-3 | 4M2P | Insoluble** | Insoluble** | Insoluble** | Insoluble** | Insoluble** |
| P-3 | IAE | Insoluble** | Insoluble** | Insoluble** | Insoluble** | Insoluble** |

4M2P = 4-methyl-2-pentanol;
IAE = Isoamyl ether;
* = polymer dissolved but turbidity not measured based on solubility of 2 wt % solution;
** = Turbidity not measurable because of non-dissolution of polymer;
NTU = Nephelometric Turbidity units.

Pattern Treatment Composition (PTC) Preparation
Pattern Treatment Composition 1 (PTC-1)

Pattern Treatment Polymer P-1 (92.2 g) was dissolved in 2-heptanone (2981.1 g) to form a 3 wt % solution. The solution was filtered with a 0.2 micron ultra-high molecular weight polyethylene (UPE) filter to provide Pattern Treatment Composition PTC-1.

Pattern Treatment Composition 2 (PTC-2)

Pattern Treatment Polymer P-2 (0.33 g) was dissolved in 2-heptanone (10.68 g) to form a 3 wt % solution. The solution was filtered with a 0.2 micron ultra-high molecular weight polyethylene (UPE) filter to provide Pattern Treatment Composition PTC-2.

Pattern Treatment Composition 3 (PTC-3)

Pattern Treatment Polymer P-3 (0.241 g) was dissolved in in 2-heptanone (15.826 g) to form a 1.5 wt % solution. The solution was filtered with a 0.2 micron ultra-high molecular weight polyethylene (UPE) filter to provide Pattern Treatment Composition PTC-3.

Lithographic Processing

Eight-inch silicon wafers having a bilayer stack including a 220 Å silicon-containing antireflective coating (SiARC) layer over a 1350 Å organic underlayer were provided. Photoresist Composition PRC-1 was coated over the bilayer stack and softbaked at 90° C. for 60 seconds on a TEL CLEAN TRACK™ LITHIUS™ i+ coater/developer, to a target resist thickness of 1000 Å. The photoresist layer was exposed using an ASML 1100 scanner with a numerical aperture (NA) of 0.75 and Dipole-35Y illumination through a reticle including line/space patterns with a pitch of 150 nm at various doses across each wafer. A post-exposure bake was performed at 90° C. for 60 seconds, and the photoresist layer was developed using an n-butylacetate (nBA) developer to form line/space patterns with a pitch of 150 nm and various critical dimensions (CDs) across the wafers. A resist-patterned wafer was observed by top-down and cross-section SEMs as a control without further processing and the average spacing between lines ($CD_i$) was measured. Other wafers were overcoated with a respective pattern treatment composition as described in Table 3 by spin coating at 1500 rpm for 30 seconds on the coater/developer. The wafers were then softbaked at 100° C. for 60 seconds, and rinsed with n-butyl acetate as a first rinse agent using a 39.5 second puddle on a TEL ACT-8 coater. The pattern-treated wafers were observed by top-down and cross-section SEM and the average spacing between lines ($CD_f$) was measured at midheight of the pattern. The wafers were next treated with a respective second rinse agent as described in Table 3 using a 38 second puddle on a TEL ACT-8 coater. Top-down and cross-sectional views of the patterns were again observed by SEM. The average spacing between lines ($CD_f$) was measured at mid-height of the pattern. The average shrink amount $\Delta CD$ ($=CD_i-CD_f$) for the pattern treatment compositions was calculated, with the results being provided below in Table 3. Top-down and cross-sectional SEM photomicrographs are provided in FIGS. 4-7 which are referenced in Table 3. As can be seen from the SEMs, footing of the pattern treatment composition polymer occurred after the first rinse step used for removal of residual pattern treatment polymer. The second rinse step using the second rinse agents effectively reduced or eliminated the footing layer.

TABLE 3

| Example | Pattern Treatment Composition | $1^{st}$ Rinse Agent | $2^{nd}$ Rinse Agent | Shrink Amt. (nm) | Footing Before $2^{nd}$ Rinse | Footing After $2^{nd}$ Rinse | SEMs |
|---|---|---|---|---|---|---|---|
| 1 | PTC-1 | nBA | RA-1 | 24.3 | X | ○ | FIG. 4 |
| 2 | PTC-2 | nBA | RA-1 | 24.1 | X | ○ | FIG. 5 |
| 3 | PTC-2 | nBA | RA-2 | 23.0 | X | ○ | FIG. 5 |
| 4 | PTC-3 | nBA | RA-1 | 27 | X | ○ | FIG. 6 |
| 5 | PTC-3 | nBA | RA-2 | 25 | X | Δ | FIG. 6 |
| 6 | PTC-3 | nBA | RA-3 | 26 | X | Δ | FIG. 6 | nBA = n-butylacetate; RA-1 = heptane; RA-2 = isoamyl ether; RA-3 = 4-methyl-2-pentanol X = severe footing; ○ = little to no footing; Δ = moderate footing.

What is claimed is:

1. A pattern treatment method, comprising:
    (a) providing a semiconductor substrate comprising a patterned feature on a surface thereof;
    (b) applying a pattern treatment composition to the patterned feature, wherein the pattern treatment composition comprises a polymer comprising a surface attachment group for forming a bond with a surface of the patterned feature and a solvent, and wherein the pattern treatment composition is free of crosslinkers;
    (c) removing residual pattern treatment composition from the substrate with a first rinse agent, leaving a coating of the polymer over and bonded to the surface of the patterned feature; and
    (d) rinsing the polymer-coated patterned feature with a second rinse agent that is different from the first rinse agent, wherein the polymer has a solubility that is greater in the first rinse agent than in the second rinse agent.

2. The pattern treatment method of claim 1, wherein the polymer is a block copolymer.

3. The pattern treatment method of claim 1, wherein the patterned feature is a photoresist pattern.

4. The pattern treatment method of claim 3, wherein the photoresist pattern is formed by a negative tone development process.

5. The pattern treatment method of claim 1, wherein the first rinse agent comprises an organic solvent.

6. The pattern treatment method of claim 1, wherein the first rinse agent is water or an aqueous solution.

7. The pattern treatment method of claim 1, wherein the second rinse agent comprises an organic solvent.

8. The pattern treatment method of claim 1, wherein the polymer is ionically bonded or hydrogen bonded to the patterned feature.

9. The pattern treatment method of claim 1, wherein footing of the polymer-coated patterned feature is reduced following rinsing with the second rinse agent relative to footing of the polymer-coated patterned feature prior to rinsing with the second rinse agent.

10. The pattern treatment method of claim 1, wherein the pattern treatment composition polymer is insoluble in the second rinse agent.

* * * * *